US010796738B2

(12) United States Patent
Bartling et al.

(10) Patent No.: US 10,796,738 B2
(45) Date of Patent: *Oct. 6, 2020

(54) PRIORITY BASED BACKUP IN NONVOLATILE LOGIC ARRAYS

(71) Applicant: Texas Instruments Incorporated, Dallas, TX (US)

(72) Inventors: Steven Craig Bartling, Plano, TX (US); Sudhanshu Khanna, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/899,302

(22) Filed: Feb. 19, 2018

(65) Prior Publication Data

US 2018/0174627 A1 Jun. 21, 2018

Related U.S. Application Data

(63) Continuation of application No. 13/770,004, filed on Feb. 19, 2013, now Pat. No. 9,899,066.

(Continued)

(51) Int. Cl.
*H03K 3/3562* (2006.01)
*G06F 11/10* (2006.01)
(Continued)

(52) U.S. Cl.
CPC .............. *G11C 7/22* (2013.01); *G06F 1/3203* (2013.01); *G06F 1/3234* (2013.01);
(Continued)

(58) Field of Classification Search
CPC .............................................. G06F 11/14–1474
See application file for complete search history.

(56) References Cited

U.S. PATENT DOCUMENTS 6,137,711 A * 10/2000 Tan .......................... G11C 11/22
365/145
6,336,161 B1 * 1/2002 Watts ........................ G06F 1/30
711/103

(Continued)

FOREIGN PATENT DOCUMENTS

CN 101263455 A 9/2008

OTHER PUBLICATIONS

First Office Action in Chinese Patent Application No. 201310537573. 3, 34 pages.

(Continued)

*Primary Examiner* — Nicholas J Simonetti
(74) *Attorney, Agent, or Firm* — Ebby Abraham; Charles A. Brill; Frank D. Cimino

(57) ABSTRACT

A processing device selectively backups only certain data based on a priority or binning structure. In one approach, a non-volatile logic controller stores the machine state by storing in non-volatile logic element arrays a portion of data representing the machine state less than all the data of the machine state. Accordingly, the non-volatile logic controller stores the machine state in the plurality of non-volatile logic element arrays by storing a first set of program data of the machine state according to a first category for backup and restoration and storing a second set of program data of the machine state according to a second category for backup and restoration.

18 Claims, 15 Drawing Sheets

Related U.S. Application Data

(60) Provisional application No. 61/698,906, filed on Sep. 10, 2012.

(51) Int. Cl.

| | | |
|---|---|---|
| *G11C 14/00* | (2006.01) | |
| *G11C 7/22* | (2006.01) | |
| *G06F 3/06* | (2006.01) | |
| *G06F 11/14* | (2006.01) | |
| *G06F 12/02* | (2006.01) | |
| *G06F 9/4401* | (2018.01) | |
| *G06F 1/3203* | (2019.01) | |
| *G06F 1/3234* | (2019.01) | |
| *G06F 1/3287* | (2019.01) | |
| *G06F 13/00* | (2006.01) | |

(52) U.S. Cl.
CPC .......... *G06F 1/3275* (2013.01); *G06F 1/3287* (2013.01); *G06F 3/0679* (2013.01); *G06F 3/0688* (2013.01); *G06F 9/4401* (2013.01); *G06F 9/4406* (2013.01); *G06F 11/1032* (2013.01); *G06F 11/1438* (2013.01); *G06F 11/1469* (2013.01); *G06F 12/0238* (2013.01); *G06F 13/00* (2013.01); *G11C 14/00* (2013.01); *H03K 3/3562* (2013.01); *Y02D 10/17* (2018.01); *Y02D 10/171* (2018.01); *Y02D 50/20* (2018.01)

(56) References Cited

U.S. PATENT DOCUMENTS

| | | | |
|---|---|---|---|
| 7,031,192 | B1 | 4/2006 | Park et al. |
| 7,046,687 | B1 | 5/2006 | Brown et al. |
| 7,639,056 | B2 | 12/2009 | Gururajarao et al. |
| 2003/0217299 | A1 | 11/2003 | Neuman et al. |
| 2008/0071972 | A1* | 3/2008 | Kimura ................ G06F 1/305 711/103 |
| 2008/0106958 | A1* | 5/2008 | Kwon .................... G11C 29/16 365/201 |
| 2008/0320259 | A1* | 12/2008 | Garg ................... G06F 11/2041 711/162 |
| 2009/0119630 | A1* | 5/2009 | Binder ................ G06F 17/5031 716/113 |
| 2009/0164846 | A1* | 6/2009 | Foster, Sr. ............. G11C 29/02 714/30 |
| 2010/0188117 | A1* | 7/2010 | Street ................. H03K 19/1733 326/38 |
| 2010/0205349 | A1* | 8/2010 | Moshayedi ......... G06F 11/1441 711/103 |
| 2012/0216085 | A1* | 8/2012 | Weingarten .......... G11C 29/028 714/718 |

OTHER PUBLICATIONS

Prosecution History in U.S. Appl. No. 13/770,004, from Feb. 19, 2013 to Feb. 1, 2018 (384 pages).

Wang, Y., et al. "A 3us Wake-up Time Nonvolatile Processor Based on Ferroelectric Flip-Flops", IEEE 2012, 4 pages.

Masui, S., et al., "Design and Application of Ferroelectric Nonvolatiile SRAM and Flip-Flop with Unlimited Read/Program Cycles and Stable Recall", IEEE 2003 Custom Integrated Circuits Conference, 2003, 4 pages.

Udayakumar, K.R., et al., "Manufacturable High-Density 8 Mbit One Transistor-One Capacitor Embedded Ferroelectric Random Access Memory", Japanese Journal of Applied Physics, vol. 47, No. 4, 2008, 4 pages.

Moise, T.S., et al., "Electrical Properties of Submicron (>0.13 μm2) Ir/PZT/Ir Capacitors Formed on W Plugs", IEEE 1999, 3 pages.

Moise, T.S., et al., "Demonstration of a 4Mb, High Density Ferroelectric Memory Embedded with a 130nm, 5LM Cu/FSG Logic Process", IEEE 2002, 4 pages.

Wang, Y., et al., "A Compression-based Area-Efficient Recovery Architecture for Nonvolatile Processors," EDAA 2012, dated Mar. 12-16, 2012, Dresden, Germany, 6 pages.

Yu, W., et al., "A Non-Volatile Microcontroller with Integrated Floating-Gate Transistors," IEEE 2011, 6 pages.

* cited by examiner

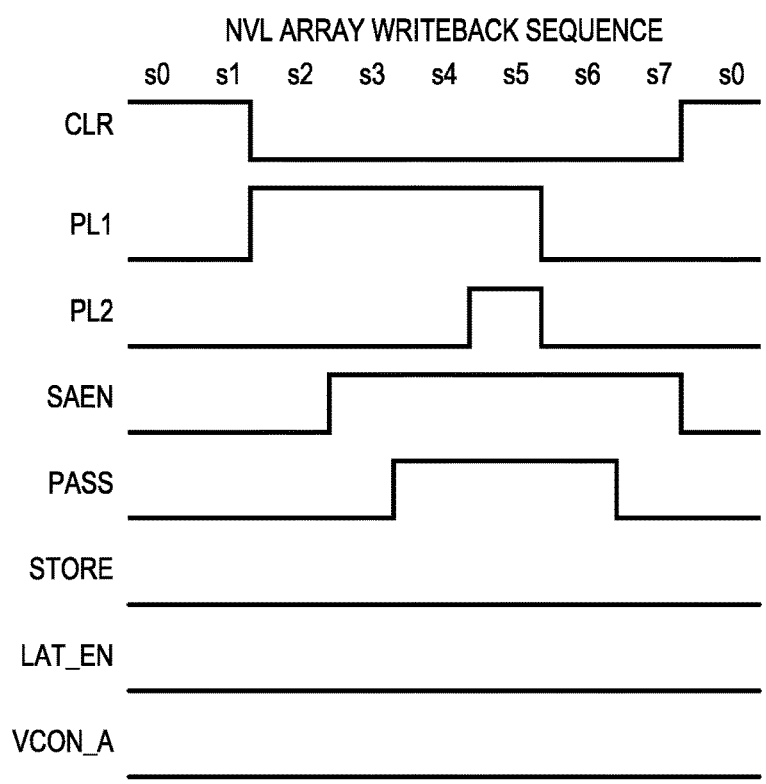
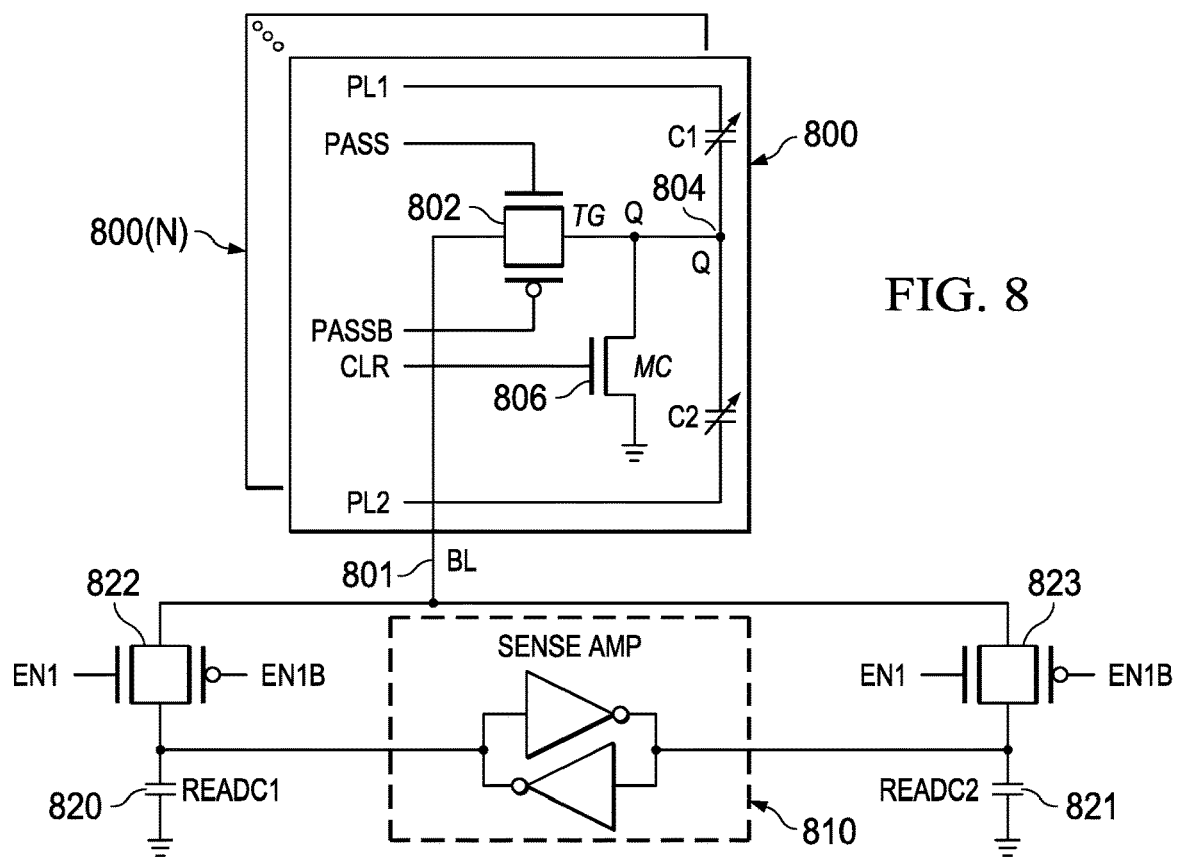
FIG. 7
FIG. 8

31 DATA COLUMNS, ONE PARITY BIT

PRIORITY BASED BACKUP IN NONVOLATILE LOGIC ARRAYS

RELATED APPLICATION(S)

This application is a continuation of U.S. patent application Ser. No. 13/770,004, filed Feb. 19, 2013, which claims the benefit of U.S. Provisional application No. 61/698,906, filed Sep. 10, 2012, both of which are incorporated by reference in their entirety herein.

TECHNICAL FIELD

This invention generally relates to nonvolatile memory cells and their use in a system, and in particular, in combination with logic arrays to provide nonvolatile logic modules.

BACKGROUND

Many portable electronic devices such as cellular phones, digital cameras/camcorders, personal digital assistants, laptop computers and video games operate on batteries. During periods of inactivity the device may not perform processing operations and may be placed in a power-down or standby power mode to conserve power. Power provided to a portion of the logic within the electronic device may be turned off in a low power standby power mode. However, presence of leakage current during the standby power mode represents a challenge for designing portable, battery operated devices. Data retention circuits such as flip-flops and/or latches within the device may be used to store state information for later use prior to the device entering the standby power mode. The data retention latch, which may also be referred to as a shadow latch or a balloon latch, is typically powered by a separate 'always on' power supply.

A known technique for reducing leakage current during periods of inactivity utilizes multi-threshold CMOS (MTCMOS) technology to implement the shadow latch. In this approach, the shadow latch utilizes thick gate oxide transistors and/or high threshold voltage ($V_t$) transistors to reduce the leakage current in standby power mode. The shadow latch is typically detached from the rest of the circuit during normal operation (e.g., during an active power mode) to maintain system performance. To retain data in a 'master-slave' flip-flop topology, a third latch, e.g., the shadow latch, may be added to the master latch and the slave latch for the data retention. In other cases, the slave latch may be configured to operate as the retention latch during low power operation. However, some power is still required to retain the saved state. For example, see U.S. Pat. No. 7,639,056, "Ultra Low Area Overhead Retention Flip-Flop for Power-Down Applications", which is incorporated by reference herein.

System on Chip (SoC) is a concept that has been around for a long time; the basic approach is to integrate more and more functionality into a given device. This integration can take the form of either hardware or solution software. Performance gains are traditionally achieved by increased clock rates and more advanced process nodes. Many SoC designs pair a microprocessor core, or multiple cores, with various peripheral devices and memory circuits.

Energy harvesting, also known as power harvesting or energy scavenging, is the process by which energy is derived from external sources, captured, and stored for small, wireless autonomous devices, such as those used in wearable electronics and wireless sensor networks. Harvested energy may be derived from various sources, such as: solar power, thermal energy, wind energy, salinity gradients, and kinetic energy, etc. However, typical energy harvesters provide a very small amount of power for low-energy electronics. The energy source for energy harvesters is present as ambient background and is available for use. For example, temperature gradients exist from the operation of a combustion engine, and in urban areas, there is a large amount of electromagnetic energy in the environment because of radio and television broadcasting, etc.

BRIEF DESCRIPTION OF THE DRAWINGS

FIGS. 4-7 are schematic and timing diagrams illustrating an example ferroelectric nonvolatile bit cell as configured in accordance with various embodiments of the invention;

FIGS. 8-9 are schematic and timing diagrams illustrating another example ferroelectric nonvolatile bit cell as configured in accordance with various embodiments of the invention;

Figure 1:
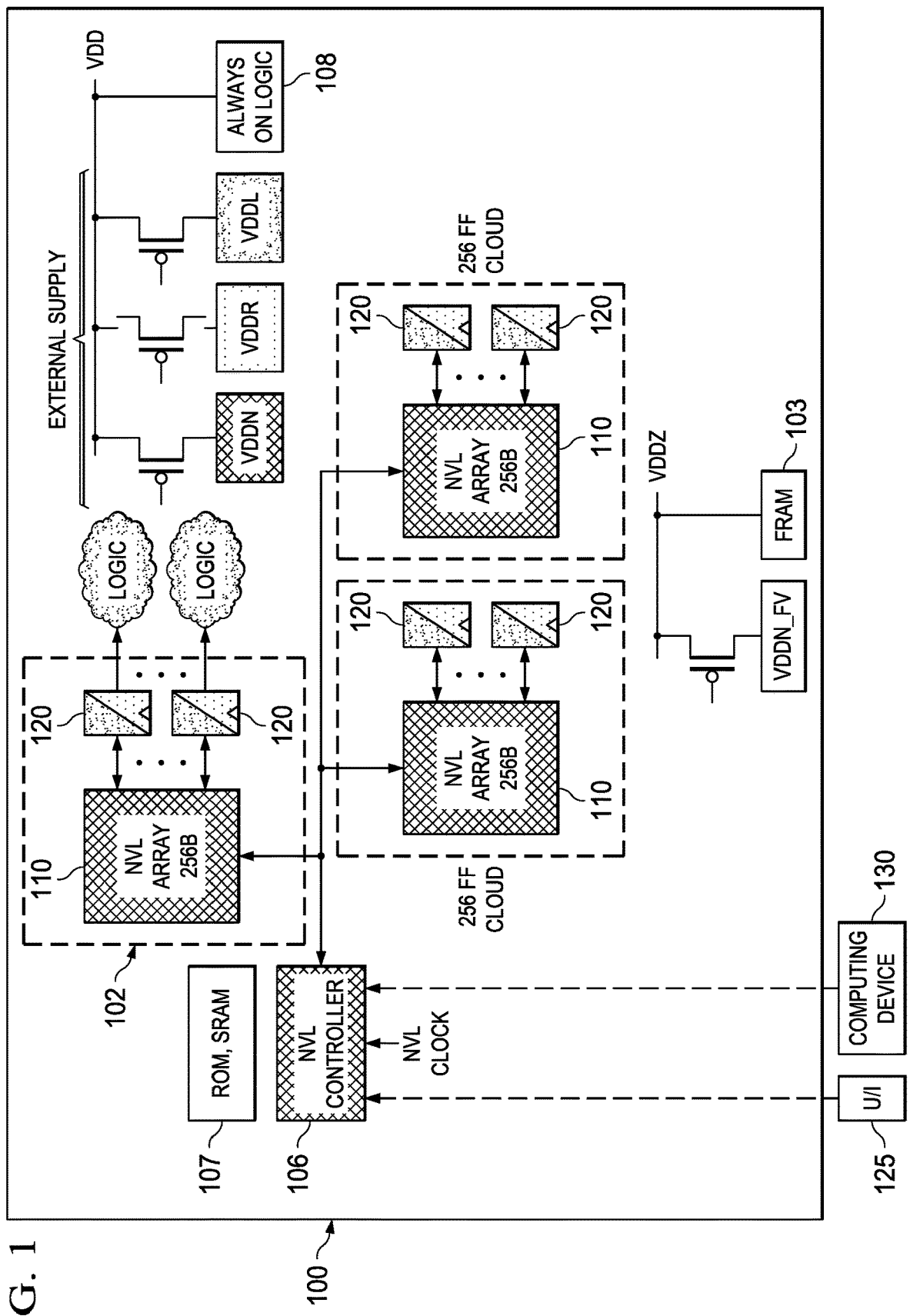
FIG. 1 is a functional block diagram of a portion of an example system on chip (SoC) as configured in accordance with various embodiments of the invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Specific embodiments of the invention will now be described in detail with reference to the accompanying figures. Like elements in the various figures are denoted by like reference numerals for consistency. In the following detailed description, numerous specific details are set forth to provide a more thorough understanding. However, it will be apparent to one of ordinary skill in the art that aspects of the invention may be practiced without these specific details. In other instances, well-known features have not been described in detail to avoid unnecessarily complicating the description.

While prior art systems made use of retention latches to retain the state of flip-flops in logic modules during low power operation, some power is still required to retain state. In contrast, nonvolatile elements can retain the state of flip flops in logic module while power is completely removed. Such logic elements will be referred to herein as Non-Volatile Logic (NVL). A micro-control unit (MCU) implemented with NVL within an SoC (system on a chip) may have the ability to stop, power down, and power up with no loss in functionality. A system reset/reboot is not required to resume operation after power has been completely removed. This capability is ideal for emerging energy harvesting applications, such as Near Field Communication (NFC), radio frequency identification (RFID) applications, and embedded control and monitoring systems, for example, where the time and power cost of the reset/reboot process can consume much of the available energy, leaving little or no energy for useful computation, sensing, or control functions. Though this description discusses an SOC containing a programmable MCU for sequencing the SOC state machines, one of ordinary skill in the art can see that NVL can be applied to state machines hard coded into ordinary logic gates or ROM, PLA, or PLD based control systems.

In one approach, an SoC includes one or more blocks of nonvolatile logic. For example, a non-volatile logic (NVL) based SoC may back up its working state (all flip-flops) upon receiving a power interrupt, have zero leakage in sleep mode, and need less than 400 ns to restore the system state upon power-up.

Without NVL, a chip would either have to keep all flip-flops powered in at least a low power retention state that requires a continual power source even in standby mode or waste energy and time rebooting after power-up. For energy harvesting applications, NVL is useful because there is no constant power source required to preserve the state of flip-flops (FFs), and even when the intermittent power source is available, boot-up code alone may consume all the harvested energy. For handheld devices with limited cooling and battery capacity, zero-leakage IC's (integrated circuits) with "instant-on" capability are ideal.

Ferroelectric random access memory (FRAM) is a non-volatile memory technology with similar behavior to DRAM (dynamic random access memory). Each individual bit can be accessed, but unlike EEPROM (electrically erasable programmable read only memory) or Flash, FRAM does not require a special sequence to write data nor does it require a charge pump to achieve required higher programming voltages. Each ferroelectric memory cell contains one or more ferroelectric capacitors (FeCap). Individual ferroelectric capacitors may be used as non-volatile elements in the NVL circuits described herein.

FIG. 1 is a functional block diagram illustrating a portion of a computing device, in this case, an example system on chip (SoC) 100 providing non-volatile logic based computing features. While the term SoC is used herein to refer to an integrated circuit that contains one or more system elements, the teachings of this disclosure can be applied to various types of integrated circuits that contain functional logic modules such as latches, integrated clock gating cells, and flip-flop circuit elements (FF) that provide non-volatile state retention. Embedding non-volatile storage elements outside the controlled environment of a large array presents reliability and fabrication challenges. An NVL bitcell based NVL array is typically designed for maximum read signal margin and in-situ margin testability as is needed for any NV-memory technology. However, adding testability features to individual NVL FFs may be prohibitive in terms of area overhead.

Figure 2:
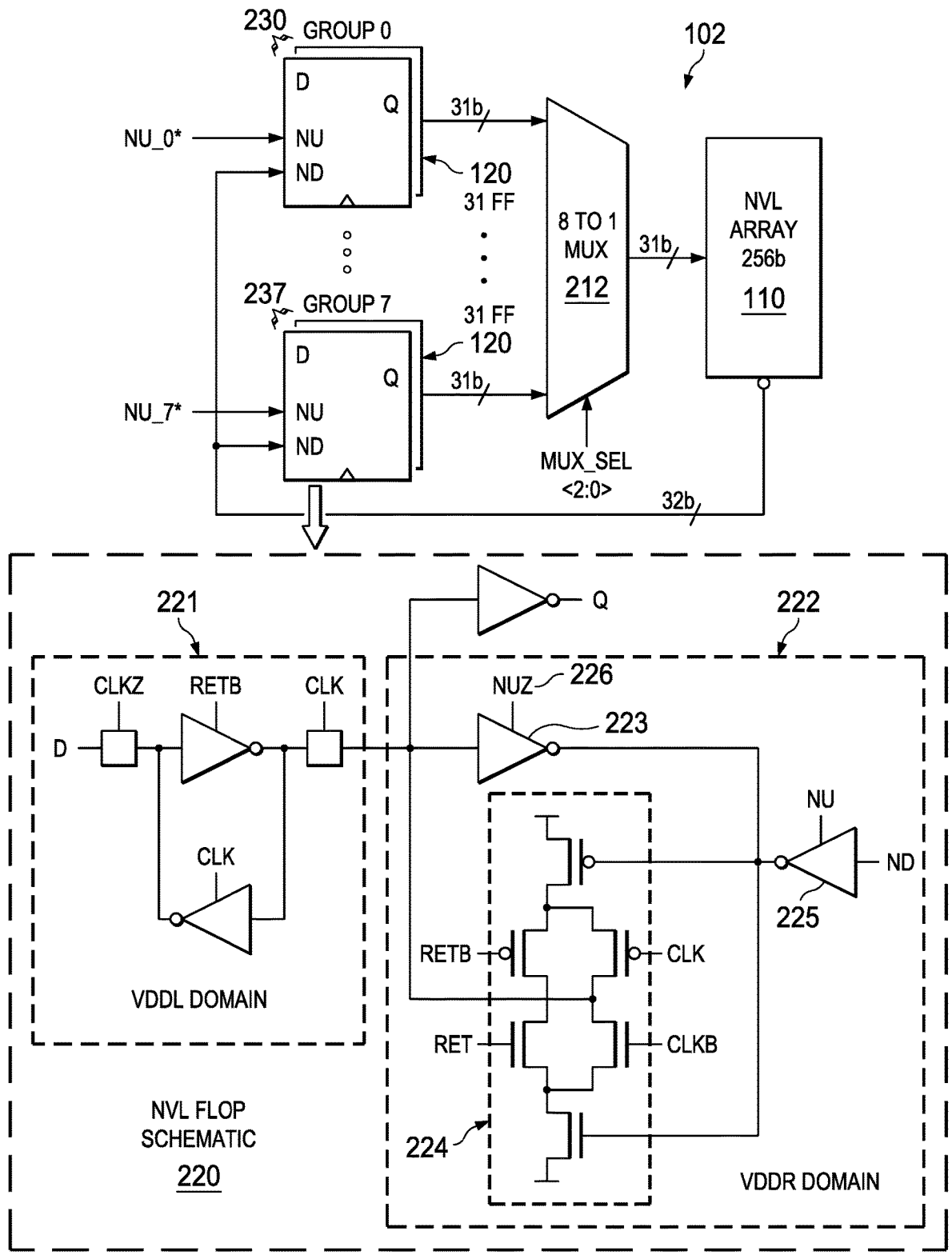
FIG. 2 is a more detailed block diagram of one flip-flop cloud used in the SoC of FIG. 1.

To amortize the test feature costs and improve manufacturability, and with reference to the example of FIGS. 1 and 2, a plurality of non-volatile logic element arrays or NVL arrays 110 are disposed with a plurality of volatile storage elements 220. At least one non-volatile logic controller 106 configured to control the plurality of NVL arrays 110 to store a machine state represented by the plurality of volatile storage elements 220 and to read out a stored machine state from the plurality of NVL arrays 110 to the plurality of volatile storage elements 220. For instance, the at least one non-volatile logic controller 106 is configured to generate a control sequence for saving the machine state to or retrieving the machine state from the plurality of NVL arrays 110. A multiplexer 212 is connected to variably connect individual ones of the volatile storage elements 220 to one or more corresponding individual ones of the NVL arrays 110.

In the illustrated example, the computing device apparatus is arranged on a single chip, here an SoC 100 implemented using 256 b mini-arrays 110, which will be referred to herein as NVL arrays, of FeCap (ferroelectric capacitor) based bitcells dispersed throughout the logic cloud to save state of the various flip flops 120 when power is removed. Each cloud 102-104 of FFs 120 includes an associated NVL array 110. Such dispersal results in individual ones of the NVL arrays 110 being arranged physically closely to and connected to receive data from corresponding individual ones of the volatile storage elements 220. A central NVL controller 106 controls all the arrays and their communication with FFs 120. While three FF clouds 102-104 are illustrated here, SoC 100 may have additional, or fewer, FF clouds all controlled by NVL controller 106. The SOC 100 can be partitioned into more than one NVL domain in which there is a dedicated NVL controller for managing the NVL arrays 110 and FFs 120 in each of the separate NVL domains. The existing NVL array embodiment uses 256 bit mini-arrays, but the arrays may have a greater or lesser number of bits as needed.

SoC 100 is implemented using modified retention flip flops 120 including circuitry configured to enable write back of data from individual ones of the plurality of non-volatile logic element arrays to the individual ones of the plurality of flip flop circuits. There are various known ways to implement a retention flip flop. For example, a data input may be latched by a first latch. A second latch coupled to the first latch may receive the data input for retention while the first latch is inoperative in a standby power mode. The first latch receives power from a first power line that is switched off during the standby power mode. The second latch receives power from a second power line that remains on during the standby mode. A controller receives a clock input and a retention signal and provides a clock output to the first latch and the second latch. A change in the retention signal is indicative of a transition to the standby power mode. The controller continues to hold the clock output at a predefined voltage level and the second latch continues to receive power from the second power line in the standby power mode, thereby retaining the data input Such a retention latch is described in more detail in U.S. Pat. No. 7,639,056, "Ultra Low Area Overhead Retention Flip-Flop for Power-Down Applications".

FIG. 2 illustrates an example retention flop architecture that does not require that the clock be held in a particular state during retention. In such a "clock free" NVL flop design, the clock value is a "don't care" during retention.

In SoC 100, modified retention FFs 120 include simple input and control modifications to allow the state of each FF to be saved in an associated FeCap bit cell in NVL array 110, for example, when the system is being transitioned to a power off state. When the system is restored, then the saved state is transferred from NVL array 110 back to each FF 120. Power savings and data integrity can be improved through implementation of particular power configurations. In one such approach, individual retention flip flop circuits include a primary logic circuit portion (master stage or latch) powered by a first power domain (such as VDDL in the below described example) and a slave stage circuit portion powered by a second power domain (such as VDDR in the below described example). In this approach, the first power domain is configured to be powered down and the second power domain is active during write back of data from the plurality of NVL arrays to the plurality of volatile storage elements. The plurality of non-volatile logic elements are configured to be powered by a third power domain (such as VDDN in the below described example) that is configured to be powered down during regular operation of the computing device apparatus.

With this configuration, a plurality of power domains can be implemented that are independently powered up or powered down in a manner that can be specifically designed to fit a given implementation. Thus, in another aspect, the computing apparatus includes a first power domain configured to supply power to switched logic elements of the computing device apparatus and a second power domain configured to supply power to logic elements configured to control signals for storing data to or reading data from the plurality of non-volatile logic element arrays. Where the plurality of volatile storage elements comprise retention flip flops, the second power domain is configured to provide power to a slave stage of individual ones of the retention flip flops. A third power domain supplies power for the plurality of non-volatile logic element arrays. In addition to the power domains, NVL arrays can be defined as domains relating to particular functions. For example, a first set of at least one of the plurality of non-volatile logic element arrays can be associated with a first function of the computing device apparatus and a second set of at least one of the plurality of non-volatile logic element arrays can be associated with a second function of the computing device apparatus. Operation of the first set of at least one of the plurality of non-volatile logic element arrays is independent of operation of the second set of at least one of the plurality of non-volatile logic element arrays. So configured, flexibility in the control and handling of the separate NVL array domains or sets allows more granulated control of the computing device's overall function.

This more specific control can be applied to the power domains as well. In one example, the first power domain is divided into a first portion configured to supply power to switched logic elements associated with the first function and a second portion configured to supply power to switched logic elements associated with the second function. The first portion and the second portion of the first power domain are individually configured to be powered up or down independently of other portions of the first power domain. Similarly, the third power domain can be divided into a first portion configured to supply power to non-volatile logic element arrays associated with the first function and a second portion configured to supply power to non-volatile logic element arrays associated with the second function. As with the first power domain, the first portion and the second portion of the third power domain are individually configured to be powered up or down independently of other portions of the third power domain.

So configured, if individual functions are not used for a given device, flip flops and NVL arrays associated with the unused functions can be respectively powered down and operated separately from the other flip flops and NVL arrays. Such flexibility in power and operation management allows one to tailor the functionality of a computing device with respect to power usage and function. This can be further illustrated in the following example design having a CPU, three SPI interfaces, three UART interfaces, three I2C interfaces, and only one logic power domain (VDDL). The logic power domain is distinguished from the retention or NVL power domains (VDDR and VDDN respectively), although these teachings can be applied to those power domains as well. Although this example device has only one logic power domain, a given application for the device might only use one of the three SPI units, one of the three UARTs and one of the three I2C peripherals. To allow applications to optimize the NVL application wake-up and sleep times and energy costs, the VDDL power domain can be partitioned into 10 separate NVL domains (one CPU, three SPI, three UART, three I2C totaling 10 NVL domains), each of which can be enabled/disabled independently of the others. So, the customer could enable NVL capability for the CPU, one SPI, one UART, and one I2C for their specific application while disabling the others. In addition, this partitioning also allows flexibility in time as well as energy and the different NVL domains can save and restore state at different points in time.

To add further flexibility, NVL domains can overlap with power domains. Referring to the above example, four power domains can be defined: one each for CPU, SPI, UART, and I2C (each peripheral power domain has three functional units) while defining three NVL domains within each peripheral domain and one for the CPU (total of 10 NVL domains again). In this case, individual power domains turn on or off in addition to controlling the NVL domains inside each power domain for added flexibility in power savings and wakeup/sleep timing.

Moreover, individual ones of the first power domain, the second power domain, and the third power domain are configured to be powered down or up independently of other ones of the first power domain, the second power domain, and the third power domain. For instance, integral power gates can be configured to be controlled to power down the individual ones of the first power domain, the second power domain, and the third power domain. As described in table 1 below, the third power domain is configured to be powered down during regular operation of the computing device apparatus, and the second power domain is configured to be powered down during a write back of data from the plurality of non-volatile logic element arrays to the plurality of volatile storage elements. A fourth power domain can be configured to supply power to real time clocks and wake-up interrupt logic.

Such approaches can be further understood in reference to the illustrated example SoC 100 where NVL arrays 110 and controller 106 are operated on an NVL power domain referred to as VDDN and are switched off during regular operation. All logic, memory blocks 107 such as ROM (read only memory) and SRAM (static random access memory), and master stage of FFs are on a logic power domain referred to as VDDL. FRAM (ferroelectric random access memory) arrays are directly connected to a dedicated global supply rail (VDDZ) maintained at a higher fixed voltage needed for FRAM (i.e., VDDL<=VDDZ, where VDDZ is a fixed supply and VDDL can be varied as long as VDDL remains at a lower potential than VDDZ). Note that FRAM arrays as shown in 103 typically contain integrated power switches that allow the FRAM arrays to be powered down as needed, though it can easily be seen that FRAM arrays without internal power switches can be utilized in conjunction with power switches that are external to the FRAM array. The slave stages of retention FFs are on a retention power domain referred to as the VDDR domain to enable regular retention in a stand-by mode of operation. Table 1 summarizes power domain operation during normal operation, system backup to NVL arrays, sleep mode, system restoration from NVL arrays, and back to normal operation. Table 1 also specifies domains used during a standby idle mode that may be initiated under control of system software in order to enter a reduced power state using the volatile retention function of the retention flip flops. A set of switches indicated at 108 are used to control the various power domains. There may be multiple switches 108 that may be distributed throughout SoC 100 and controlled by software executed by a processor on SoC 100 and/or by a hardware controller (not shown) within SoC 100. There may be additional domains in addition to the three illustrated here, as will be described later.

TABLE 1 system power modes

| SoC Mode | Trigger | Trigger source | VDDL | VDDR | VDDN |
|---|---|---|---|---|---|
| Regular operation | na | na | ON | ON | OFF |
| System backup to NVL | Power bad | external | ON | ON | ON |
| Sleep mode | Backup done | NVL controller | OFF | OFF | OFF |
| System restoration from NVL | Power good | external | OFF | ON | ON |
| Regular operation | Restore done | NVL controller | ON | ON | OFF |
| Standby retention mode | idle | System software | OFF | ON | OFF |

State info could be saved in a large centralized FRAM array, but would require a more time to enter sleep mode, longer wakeup time, excessive routing, and power costs caused by the lack of parallel access to system FFs.

FIG. 2 is a more detailed block diagram of one FF cloud 102 used in SoC 100. In this embodiment, each FF cloud includes up to 248 flip flops and each NVL array is organized as an 8×32 bit array, but one bit is used for parity in this embodiment. However, in other embodiments, the number of flip flops and the organization of the NVL array may have a different configuration, such as 4×m, 16×m, etc, where m is chosen to match the size of the FF cloud. In some embodiments, all of the NVL arrays in the various clouds may be the same size, while in other approaches there may be different size NVL arrays in the same SoC.

Block 220 is a more detailed schematic of each retention FF 120. Several of the signals have an inverted version indicated by suffix "B" (referring to "bar" or /), such as RET and RETB, CLK and CLKB, etc. Each retention FF includes a master latch 221 and a slave latch 222. Slave latch 222 is formed by inverter 223 and inverter 224. Inverter 224 includes a set of transistors controlled by the retention signal (RET, RETB) that are used to retain the FF state during low power sleep periods, during which power domain VDDR remains on while power domain VDDL is turned off, as described above and in Table 1.

NVL array 110 is logically connected with the 248 FFs it serves in cloud 102. Generally speaking, to enable data transfer from an NVL array to the FFs, individual FFs include circuitry configured to enable write back of data from individual ones of the plurality of NVL arrays 110. In the illustrated example, two additional ports are provided on the slave latch 222 of each FF as shown in block 220. A data input port (gate 225) is configured to insert data ND from one of the NVL arrays 110 to an associated volatile storage element 220. The data input port is configured to insert the data ND by allowing passage of a stored data related signal from the one of the NVL arrays to a slave stage of the associated flip flop circuit in response to receiving an update signal NU from the at least one non-volatile logic controller 106 on a data input enable port to trigger the data input port. Inverter 223 is configured to be disabled in response to receiving the inverted NVL update signal NUZ to avoid an electrical conflict between the tri-state inverter 223 and the NVL data port input tri-state inverter 225.

More specifically, in the illustrated example, the inv-inv feedback pair (223 and 224) form the latch itself. These inverters make a very stable configuration for holding the data state and will fight any attempts to change the latch state unless at least one of the inverters is disabled to prevent electrical conflict when trying to overwrite the current state with the next state via one of the data ports. The illustrated NVL FF 220 includes two data ports that access the slave latch 222 as compared to one data port for a regular flop. One port transfers data from the master stage 221 to the slave stage 222 via the cmos pass gate controlled by the clock. When using this port to update the slave state 221, the inverter 224 driving onto the output node of the pass gate controlled by CLK is disabled to avoid an electrical conflict while the inverter 223 is enabled to transfer the next state onto the opposite side of the latch so that both sides of the latch have the next state in preparation for holding the data when clock goes low (for a posedge FF).

For the same reason, the inverter 223 is disabled when the ND data port is activated by NU transitioning to the active high state to avoid an electrical conflict on the ND port. The second inverter 224 is enabled to transfer the next state onto the opposite side of the latch so that both sides of the latch have the next state to be latched when NU goes low. In this example, the NU port does not in any way impact the other data port controlled by the clock. On a dual port FF, having both ports active at the same time is an illegal control condition, and the resulting port conflict means the resulting next state will be indeterminate. To avoid a port conflict, the system holds the clock in the inactive state if the slave state is updated while in functional mode. In retention mode, the RET signal along with supporting circuits inside the FF are used to prevent electrical conflicts independent of the state of CLK while in retention mode (see the inverter controlled by RETB in the master stage).

As illustrated these additional elements are disposed in the slave stage 222 of the associated FF. The additional transistors, however, are not on the critical path of the FF and have only 1.8% and 6.9% impact on normal FF performance and power (simulation data) in this particular implementation. When data from the NVL array is valid on the ND (NVL-Data) port, the NU (NVL-Update) control input is pulsed high for a cycle to write to the FF. The thirty-one bit data output of an NVL array fans out to ND ports of eight thirty-one bit FF groups.

To save flip-flop state, a multiplexer is configured to pass states from a plurality of the individual ones of the plurality of volatile storage elements 220 for essentially simultaneous storage in an individual one of the plurality of NVL arrays 110. For instance, the multiplexer may be configured to connect to N groups of M volatile storage elements of the plurality of volatile storage elements per group and to an N by M size NVL array of the plurality of NVL arrays. In this configuration, the multiplexer connects one of the N groups to the N by M size NVL array to store data from the M volatile storage elements into a row of the N by M size NVL array at one time. In the illustrated example, Q outputs of 248 FFs are connected to the 31 b parallel data input of NVL array 110 through a 31 b wide 8-1 mux 212. To minimize FF loading, the mux may be broken down into smaller muxes based on the layout of the FF cloud and placed close to the FFs they serve. Again, the NVL controller synchronizes writing to the NVL array, and the select signals MUX_SEL <2:0> of 8-1 mux 212.

When the FFs are operating in a retention mode, a clock CLK of the computing device is a "don't care" such that it is irrelevant for the volatile storage elements with respect to updating the slave stage state whenever the NU signal is active, whereby the non-volatile logic controller is configured to control and effect storage of data from individual ones of the volatile storage elements into individual ones of the non-volatile storage elements. In other words, the clock CLK control is not needed during NVL data recovery during retention mode, but the clock CLK should be controlled at the system level once the system state is restored, right before the transition between retention mode and functional mode. In another approach, the NVL state can be recovered to the volatile storage elements when the system is in a functional mode. In this situation where the VDDL power is active, the clock CLK is held in the inactive state for the volatile storage elements during the data restoration from the NVL array, whereby the non-volatile logic controller is configured to control and effect transfer of data from individual ones of the non-volatile storage elements into individual ones of the volatile storage elements. For example, a system clock CLK is typically held low for positive edge FF based logic and held high for negative edge FF based logic.

Generally speaking, to move from regular operation into system backup mode, the first step is to stop the system clock(s) in an inactive state to freeze the machine state to not change while the backup is in progress. The clocks are held in the inactive state until backup is complete. After backup is complete, all power domains are powered down and the state of the clock becomes a don't care in sleep mode by definition.

When restoring the state from NVL arrays, the FF are placed in a retention state (see Table 2 below) in which the clock continues to be a don't care as long as the RET signal is active (clock can be a don't care by virtue of special transistors added to each retention FF and is controlled by the RET signal). While restoring NVL state, the flops remain in retention mode so clock remains a don't care. Once the NVL state is recovered, the state of the machine logic that controls the state of the system clocks will also be restored to the state they were in at the time of the state backup, which also means that for this example all the controls (including the volatile storage elements or FF's) that placed the system clock into inactive states have now been restored such that the system clocks will remain in the inactive state upon completion of NVL data recovery. Now the RET signal can be deactivated, and the system will sit quiescent with clocks deactivated until the NVL controller signals to the power management controller that the restoration is complete, in response to which the power management controller will enable the clocks again.

To restore flip-flop state during restoration, NVL controller 106 reads an NVL row in NVL array 110 and then pulses the NU signal for the appropriate flip-flop group. During system restore, retention signal RET is held high and the slave latch is written from ND with power domain VDDL unpowered; at this point the state of the system clock CLK is a don't care. FF's are placed in the retention state with VDDL=0V and VDDR=VDD in order to suppress excess power consumption related to spurious data switching that occurs as each group of 31 FF's is updated during NVL array read operations. Suitably modified non-retention flops can be used in NVL based SOC's at the expense of higher power consumption during NVL data recovery operations.

System clock CLK should start from low once VDDL comes up and thereafter normal synchronous operation continues with updated information in the FFs. Data transfer between the NVL arrays and their respective FFs can be done in serial or parallel or any combination thereof to tradeoff peak current and backup/restore time. Because a direct access is provided to FFs controlled by at least one non-volatile logic controller that is separate from a central processing unit for the computing device apparatus, intervention from a microcontroller processing unit (CPU) is not required for NVL operations; therefore the implementation is SoC/CPU architecture agnostic. Table 2 summarizes operation of the NVL flip flops.

TABLE 2

NVL Flip Flop truth table

| mode | Clock (CLK) | Retention (RET) | NVL update (NU) | Value saved |
|---|---|---|---|---|
| Regular operation | Pulsed | 0 | 0 | From D input |
| retention | X | 1 | 0 | Q value |
| NVL system backup | 0 | 0 | 0 | From Q output |
| NVL system restore | X | 1 | pulsed | NVL cell bit data (ND) |

Because the at least one non-volatile logic controller is configured to variably control data transfer to or reading from the plurality of non-volatile arrays in parallel, sequentially, or in any combination thereof based on input signals, system designers have additional options with respect to tailoring system operation specifications to particular needs. For instance, because no computation can occur on an MCU SOC during the time the system enters a low power system state or to wakeup from a low power state, minimizing the wakeup or go to sleep time is advantageous. On the other hand, non-volatile state retention is power intensive because significant energy is needed to save and restore state to or from non-volatile elements such as ferro-electric capacitors. The power required to save and restore system state can exceed the capacity of the power delivery system and cause problems such as electromigration induced power grid degradation, battery life reduction due to excessive peak current draw, or generation of high levels of noise on the power supply system that can degrade signal integrity on die. Thus, allowing a system designer to be able to balance between these two concerns is desirable.

In one such approach, the at least one non-volatile logic controller 106 is configured to receive the input signals through a user interface 125, such as those known to those of skill in the art. In another approach, the at least one non-volatile logic controller is configured to receive the input signals from a separate computing element 130 that may be executing an application. In one such approach, the separate computing element is configured to execute the application to determine a reading sequence for the plurality of non-volatile arrays based at least in part on a determination of power and computing resource requirements for the computing device apparatus 130. So configured, a system user can manipulate the system state store and retrieve procedure to fit a given design.

Figure 3:
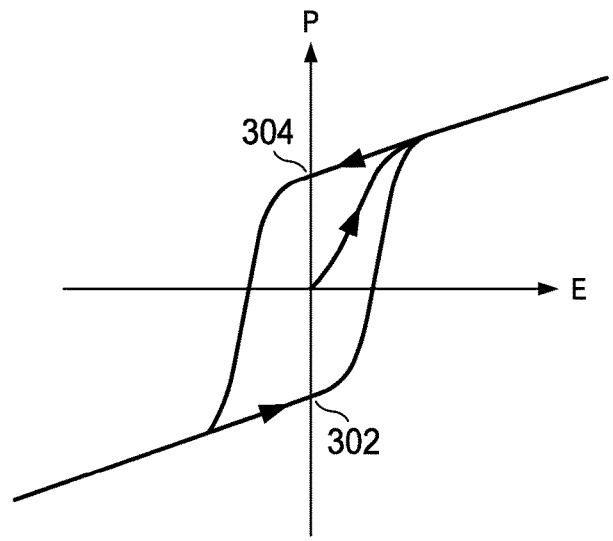
FIG. 3 is a plot illustrating polarization hysteresis exhibited by a ferroelectric capacitor.

FIG. 3 is a plot illustrating polarization hysteresis exhibited by a ferroelectric capacitor. The general operation of ferroelectric bit cells is known. When most materials are polarized, the polarization induced, P, is almost exactly proportional to the applied external electric field E; so the polarization is a linear function, referred to as dielectric polarization. In addition to being nonlinear, ferroelectric materials demonstrate a spontaneous nonzero polarization as illustrated in FIG. 3 when the applied field E is zero. The distinguishing feature of ferroelectrics is that the spontaneous polarization can be reversed by an applied electric field; the polarization is dependent not only on the current electric field but also on its history, yielding a hysteresis loop. The term "ferroelectric" is used to indicate the analogy to ferromagnetic materials, which have spontaneous magnetization and also exhibit hysteresis loops.

The dielectric constant of a ferroelectric capacitor is typically much higher than that of a linear dielectric because of the effects of semi-permanent electric dipoles formed in the crystal structure of the ferroelectric material. When an external electric field is applied across a ferroelectric dielectric, the dipoles tend to align themselves with the field direction, produced by small shifts in the positions of atoms that result in shifts in the distributions of electronic charge in the crystal structure. After the charge is removed, the dipoles retain their polarization state. Binary "0"s and "1"s are stored as one of two possible electric polarizations in each data storage cell. For example, in the figure a "1" may be encoded using the negative remnant polarization 302, and a "0" may be encoded using the positive remnant polarization 304, or vice versa.

Ferroelectric random access memories have been implemented in several configurations. A one transistor, one capacitor (1T-1C) storage cell design in an FeRAM array is similar in construction to the storage cell in widely used DRAM in that both cell types include one capacitor and one access transistor. In a DRAM cell capacitor, a linear dielectric is used, whereas in an FeRAM cell capacitor the dielectric structure includes ferroelectric material, typically lead zirconate titanate (PZT). Due to the overhead of accessing a DRAM type array, a 1T-1C cell is less desirable for use in small arrays such as NVL array 110.

A four capacitor, six transistor (4C-6T) cell is a common type of cell that is easier to use in small arrays. An improved four capacitor cell will now be described.

Figure 4:
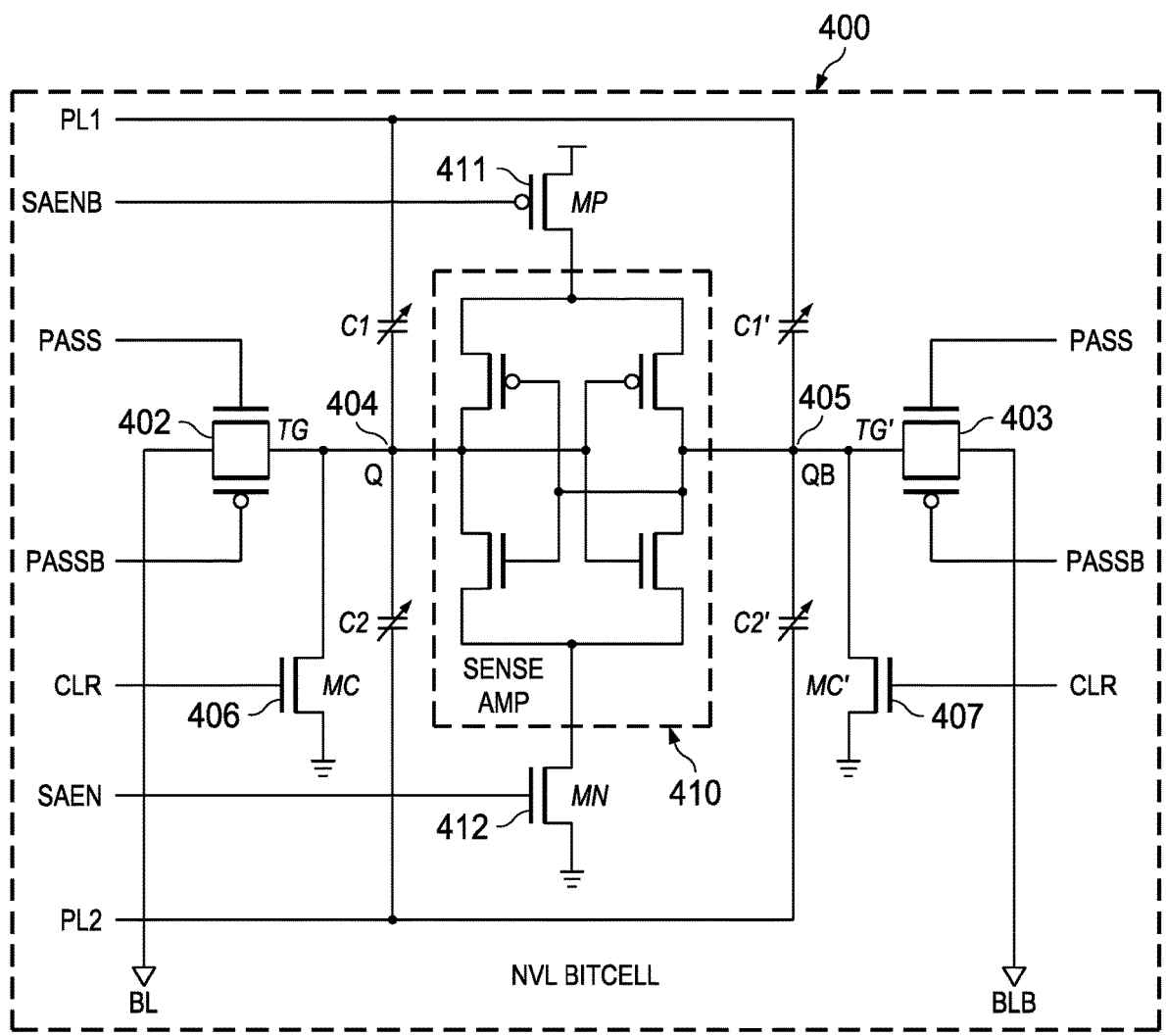

FIG. 4 is a schematic illustrating one embodiment of a ferroelectric nonvolatile bitcell 400 that includes four capacitors and twelve transistors (4C-12T). The four FeCaps are arranged as two pairs in a differential arrangement. FeCaps C1 and C2 are connected in series to form node Q 404, while FeCaps C1' and C2' are connected in series to form node QB 405, where a data bit is written into node Q and stored in FeCaps C1 and C2 via bit line BL and an inverse of the data bit is written into node QB and stored in FeCaps C1' and C2' via inverse bitline BLB. Sense amp 410 is coupled to node Q and to node QB and is configured to sense a difference in voltage appearing on nodes Q, QB when the bitcell is read. The four transistors in sense amp 410 are configured as two cross coupled inverters to form a latch. Pass gate 402 is configured to couple node Q to bitline B and pass gate 403 is configured to couple node QB to bit line BLB. Each pass gate 402, 403 is implemented using a PMOS device and an NMOS device connected in parallel. This arrangement reduces voltage drop across the pass gate during a write operation so that nodes Q, QB are presented with a higher voltage during writes and thereby a higher polarization is imparted to the FeCaps. Plate line 1 (PL1) is coupled to FeCaps C1 and C1' and plate line 2 (PL2) is coupled to FeCaps C2 and C2'. The plate lines are use to provide biasing to the FeCaps during reading and writing operations. Alternatively, in another embodiment the cmos pass gates can be replaced with NMOS pass gates that use a pass gate enable that is has a voltage higher than VDDL. The magnitude of the higher voltage must be larger than the usual NMOS Vt in order to pass a undegraded signal from the bitcell Q/QB nodes to/from the bitlines BL/BLB (I.E. Vpass_gate_control must be >VDDL+Vt).

Typically, there will be an array of bit cells 400. There may then be multiple columns of similar bitcells to form an n row by m column array. For example, in SoC 100, the NVL arrays are 8×32; however, as discussed earlier, different configurations may be implemented.

Figure 5:
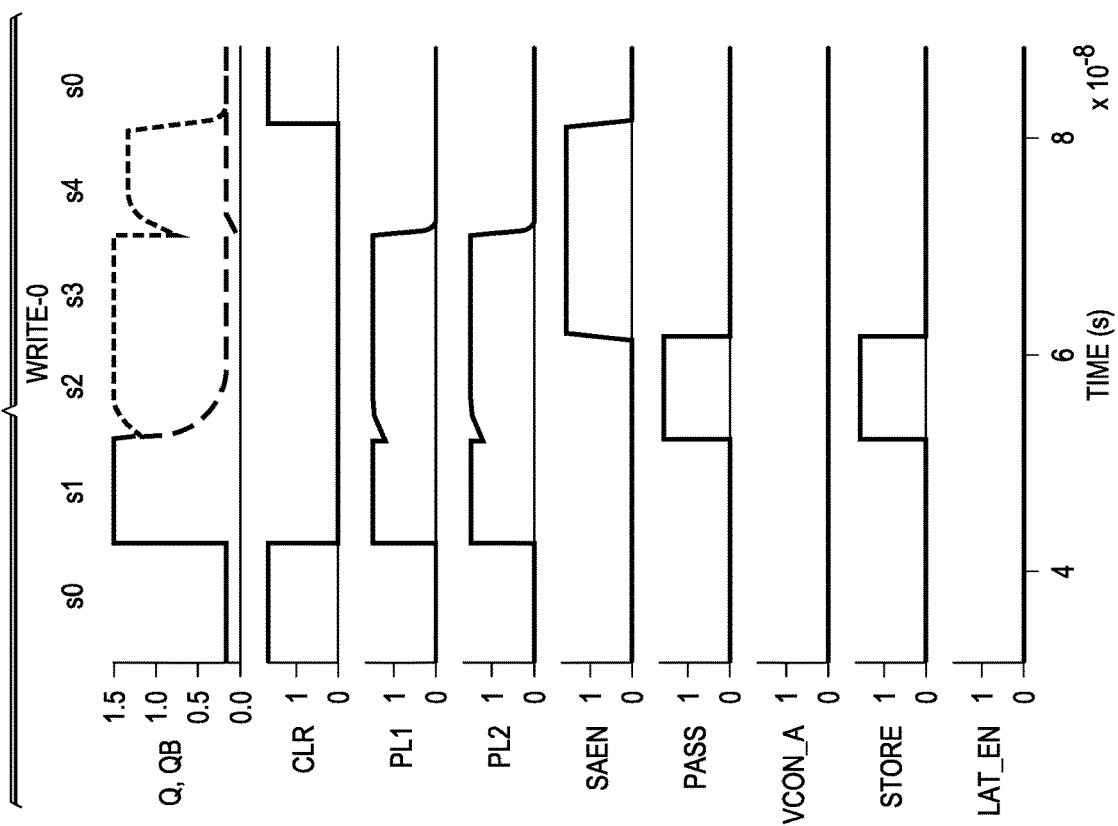
Figure 6:
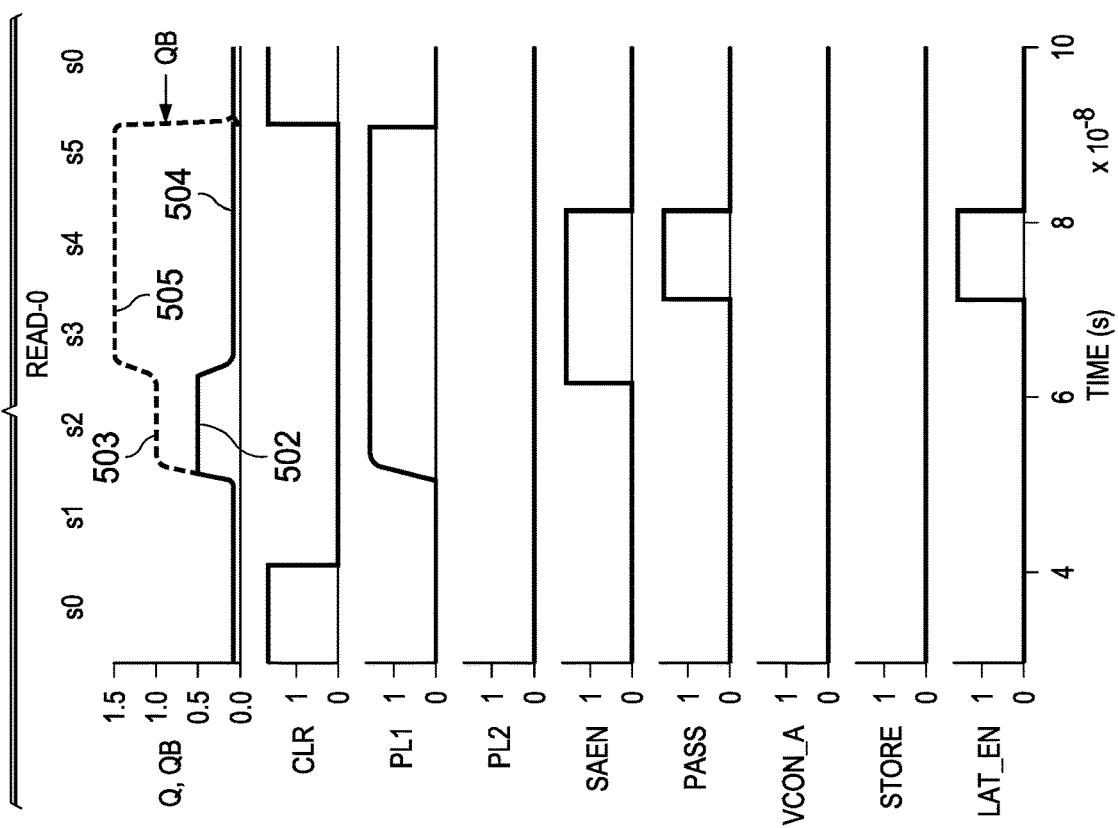

FIGS. 5 and 6 are timing diagram illustrating read and write waveforms for reading a data value of logical 0 and writing a data value of logical 0, respectively. Reading and writing to the NVL array is a multi-cycle procedure that may be controlled by the NVL controller and synchronized by the NVL clock. In another embodiment, the waveforms may be sequenced by fixed or programmable delays starting from a trigger signal, for example. During regular operation, a typical 4C-6T bitcell is susceptible to time dependent dielectric breakdown (TDDB) due to a constant DC bias across FeCaps on the side storing a "1". In a differential bitcell, since an inverted version of the data value is also stored, one side or the other will always be storing a "1".

To avoid TDDB, plate line PL1, plate line PL2, node Q and node QB are held at a quiescent low value when the cell is not being accessed, as indicated during time periods s0 in FIGS. 5, 6. Power disconnect transistors MP 411 and MN 412 allow sense amp 410 to be disconnected from power during time periods s0 in response to sense amp enable signals SAEN and SAENB. Clamp transistor MC 406 is coupled to node Q and clamp transistor MC' 407 is coupled to node QB. Clamp transistors 406, 407 are configured to clamp the Q and QB nodes to a voltage that is approximately equal to the low logic voltage on the plate lines in response to clear signal CLR during non-access time periods s0, which in this embodiment equal 0 volts, (the ground potential). In this manner, during times when the bit cell is not being accessed for reading or writing, no voltage is applied across the FeCaps and therefore TDDB is essentially eliminated. The clamp transistors also serve to prevent any stray charge buildup on nodes Q and QB due to parasitic leakage currents. Build up of stray charge may cause the voltage on Q or QB to rise above 0 v, leading to a voltage differential across the FeCaps between Q or QB and PL1 and PL2. This can lead to unintended depolarization of the FeCap remnant polarization and could potentially corrupt the logic values stored in the FeCaps.

In this embodiment, Vdd is 1.5 volts and the ground reference plane has a value of 0 volts. A logic high has a value of approximately 1.5 volts, while a logic low has a value of approximately 0 volts. Other embodiments that use logic levels that are different from ground for logic 0 (low) and Vdd for logic 1 (high) would clamp nodes Q, QB to a voltage corresponding to the quiescent plate line voltage so that there is effectively no voltage across the FeCaps when the bitcell is not being accessed.

In another embodiment, two clamp transistors may be used. Each of these two transistors is used to clamp the voltage across each FeCap to be no greater than one transistor Vt (threshold voltage). Each transistor is used to short out the FeCaps. In this case, for the first transistor, one terminal connects to Q and the other one connects to PL1, while for transistor two, one terminal connects to Q and the other connects to PL2. The transistor can be either NMOS or PMOS, but NMOS is more likely to be used.

Typically, a bit cell in which the two transistor solution is used does not consume significantly more area than the one transistor solution. The single transistor solution assumes that PL1 and PL2 will remain at the same ground potential as the local VSS connection to the single clamp transistor, which is normally a good assumption. However, noise or other problems may occur (especially during power up) that might cause PL1 or PL2 to glitch or have a DC offset between the PL1/PL2 driver output and VSS for brief periods; therefore, the two transistor design may provide a more robust solution.

To read bitcell 400, plate line PL1 is switched from low to high while keeping plate line PL2 low, as indicated in time period s2. This induces voltages on nodes Q, QB whose values depend on the capacitor ratio between C1-C2 and C1'-C2' respectively. The induced voltage in turn depends on the remnant polarization of each FeCap that was formed during the last data write operation to the FeCap's in the bit cell. The remnant polarization in effect "changes" the effective capacitance value of each FeCap which is how FeCaps provide nonvolatile storage. For example, when a logic 0 was written to bitcell 400, the remnant polarization of C2 causes it to have a lower effective capacitance value, while the remnant polarization of C1 causes it to have a higher effective capacitance value. Thus, when a voltage is applied across C1-C2 by switching plate line PL1 high while holding plate line PL2 low, the resultant voltage on node Q conforms to equation (1). A similar equation holds for node QB, but the order of the remnant polarization of C1' and C2' is reversed, so that the resultant voltages on nodes Q and QB provide a differential representation of the data value stored in bit cell 400, as illustrated at 502, 503 in FIG. 5.

$$V(Q) = V(PL1)\left(\frac{C2}{C1+C2}\right) \quad (1)$$

The local sense amp 410 is then enabled during time period s3. After sensing the differential values 502, 503, sense amp 410 produces a full rail signal 504, 505. The resulting full rail signal is transferred to the bit lines BL, BLB during time period s4 by asserting the transfer gate enable signals PASS, PASSB to enable transfer gates 402, 403 and thereby transfer the full rail signals to an output latch responsive to latch enable signal LAT_EN that is located in the periphery of NVL array 110, for example FIG. 6 is a timing diagram illustrating writing a logic 0 to bit cell 400. The write operation begins by raising both plate lines to Vdd during time period s1. This is called the primary storage method. The signal transitions on PL1 and PL2 are capacitively coupled onto nodes Q and QB, effectively pulling both storage nodes almost all the way to VDD (1.5v). Data is provided on the bit lines BL, BLB and the transfer gates 402, 403 are enabled by the pass signal PASS during time periods s2-s4 to transfer the data bit and its inverse value from the bit lines to nodes Q, QB. Sense amp 410 is enabled by sense amp enable signals SAEN, SAENB during time period s3, s4 to provide additional drive after the write data drivers have forced adequate differential on Q/QB during time period s2. However, to avoid a short from the sense amp to the 1.2 v driver supply, the write data drivers are turned off at the end of time period s2 before the sense amp is turned on during time periods s3, s4. In an alternative embodiment called the secondary store method, write operations hold PL2 at 0 v or ground throughout the data write operation. This can save power during data write operations, but reduces the resulting read signal margin by 50% as C2 and C2' no longer hold data via remnant polarization and only provide a linear capacitive load to the C1 and C2 FeCaps.

Key states such as PL1 high to SAEN high during s2, SAEN high pulse during s3 during read and FeCap DC bias states s3-4 during write can selectively be made multi-cycle to provide higher robustness without slowing down the NVL clock.

For FeCap based circuits, reading data from the FeCap's may partially depolarize the capacitors. For this reason, reading data from FeCaps is considered destructive in nature; i.e. reading the data may destroy the contents of the FeCap's or reduce the integrity of the data at a minimum. For this reason, if the data contained in the FeCap's is expected to remain valid after a read operation has occurred, the data must be written back into the FeCaps.

In certain applications, specific NVL arrays may be designated to store specific information that will not change over a period of time. For example, certain system states can be saved as a default return state where returning to that state is preferable to full reboot of the device. The reboot and configuration process for a state of the art ultra low power SoC can take 1000-10000 clock cycles or more to reach the point where control is handed over to the main application code thread. This boot time becomes critical for energy harvesting applications in which power is intermittent, unreliable, and limited in quantity. The time and energy cost of rebooting can consume most or all of the energy available for computation, preventing programmable devices such as MCU's from being used in energy harvesting applications. An example application would be energy harvesting light switches. The energy harvested from the press of the button on the light switch represents the entire energy available to complete the following tasks: 1) determine the desired function (on/off or dimming level), 2) format the request into a command packet, 3) wake up a radio and squirt the packet over an RF link to the lighting system. Known custom ASIC chips with hard coded state machines are often used for this application due to the tight energy constraints, which makes the system inflexible and expensive to change because new ASIC chips have to be designed and fabricated whenever any change is desired. A programmable MCU SOC would be a much better fit, except for the power cost of the boot process consumes most of the available energy, leaving no budget for executing the required application code.

To address this concern, in one approach, at least one of the plurality of non-volatile logic element arrays is configured to store a boot state representing a state of the computing device apparatus after a given amount of a boot process is completed. The at least one non-volatile logic controller in this approach is configured to control restoration of data representing the boot state from the at least one of the plurality of non-volatile logic element arrays to corresponding ones of the plurality of volatile storage elements in response to detecting a previous system reset or power loss event for the computing device apparatus. To conserve power over a typical read/write operation for the NVL arrays, the at least one non-volatile logic controller can be configured to execute a round-trip data restoration operation that automatically writes back data to an individual non-volatile logic element after reading data from the individual non-volatile logic element without completing separate read and write operations.

An example execution of a round-trip data restoration is illustrated in FIG. 7, which illustrates a writeback operation on bitcell 400, where the bitcell is read, and then written to the same value. As illustrated, initiating reading of data from the individual non-volatile logic element is started at a first time S1 by switching a first plate line PL1 high to induce a voltage on a node of a corresponding ferroelectric capacitor bit cell based on a capacitance ratio for ferroelectric capacitors of the corresponding ferroelectric capacitor bit cell. If clamp switches are used to ground the nodes of the ferroelectric capacitors, a clear signal CLR is switched from high to low at the first time S1 to unclamp those aspects of the individual non-volatile logic element from electrical ground. At a second time S2, a sense amplifier enable signal SAEN is switched high to enable a sense amplifier to detect the voltage induced on the node and to provide an output signal corresponding to data stored in the individual non-volatile logic element. At a third time S3, a pass line PASS is switched high to open transfer gates to provide an output signal corresponding to data stored in the individual non-volatile logic element. At a fourth time S4, a second plate line PL2 is switched high to induce a polarizing signal across the ferroelectric capacitors to write data back to the corresponding ferroelectric capacitor bit cell corresponding to the data stored in the individual non-volatile logic element. To the individual non-volatile logic element to a non-volatile storage state having the same data stored therein, at a fifth time S5 the first plate line PL1 and the second plate line PL2 are switched low, the pass line PASS is switched low at the sixth time S6, and the sense amplifier enable signal SAEN is switched law at the seventh time S7. If clamp switches are used to ground the nodes of the ferroelectric capacitors, at the seventh time a clear signal CLR is switched from low to high to clamp the aspects of the individual non-volatile logic element to the electrical ground to help maintain data integrity as discussed herein. This process includes a lower total number of transitions than what is needed for distinct and separate read and write operations (read, then write). This lowers the overall energy consumption.

Bitcell 400 is designed to maximize read differential across Q/QB in order to provide a highly reliable first generation of NVL products. Two FeCaps are used on each side rather than using one FeCap and constant BL capacitance as a load because this doubles the differential voltage that is available to the sense amp. A sense amp is placed inside the bitcell to prevent loss of differential due to charge sharing between node Q and the BL capacitance and to avoid voltage drop across the transfer gate. The sensed voltages are around VDD/2, and a HVT transfer gate takes a long time to pass them to the BL. Bitcell 400 helps achieve twice the signal margin of a regular FRAM bitcell known in the art, while not allowing any DC stress across the FeCaps.

The timing of signals shown in FIGS. 5 and 6 are for illustrative purposes. Various embodiments may signal sequences that vary depending on the clock rate, process parameters, device sizes, etc. For example, in another embodiment, the timing of the control signals may operate as follows. During time period S1: PASS goes from 0 to 1 and PL1/PL2 go from 0 to 1. During time period S2: SAEN goes from 0 to 1, during which time the sense amp may perform level shifting as will be described later, or provides additional drive strength for a non-level shifted design. During time period S3: PL1/PL2 go from 1 to 0 and the remainder of the waveforms remain the same, but are moved up one clock cycle. This sequence is one clock cycle shorter than that illustrated in FIG. 6.

In another alternative, the timing of the control signals may operate as follows. During time period S1: PASS goes from 0 to 1 (BL/BLB, Q/QB are 0 v and VDDL respectively). During time period S2: SAEN goes from 0 to 1 (BL/BLB, Q/QB are 0 v and VDDN respectively). During time period S3: PL1/PL2 go from 0 to 1 (BL/Q is coupled above ground by PL1/PL2 and is driven back low by the SA and BL drivers). During time period S4: PL1/PL2 go from 1 to 0 and the remainder of the waveforms remain the same.

Figure 9:
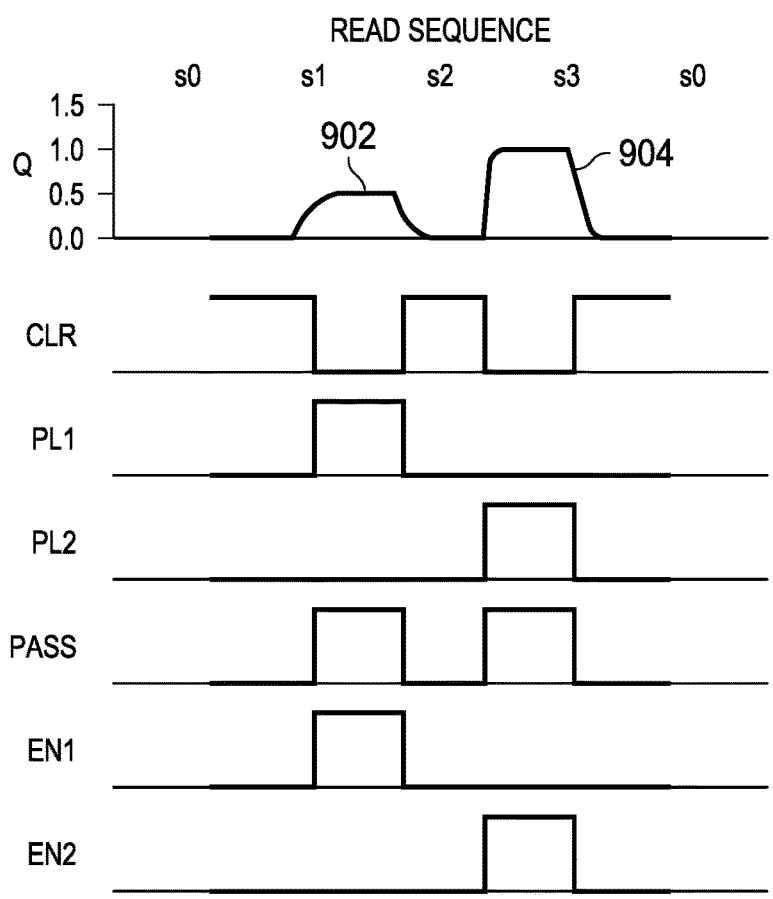

FIGS. 8-9 are a schematic and timing diagram illustrating another embodiment of a ferroelectric nonvolatile bit cell 800, a 2C-3T self-referencing based NVL bitcell. The previously described 4-FeCap based bitcell 400 uses two FeCaps on each side of a sense amp to get a differential read with double the margin as compared to a standard 1C-1T FRAM bitcell. However, a 4-FeCap based bitcell has a larger area and may have a higher variation because it uses more FeCaps.

Bitcell 800 helps achieve a differential 4-FeCap like margin in lower area by using itself as a reference, referred to herein as self-referencing. By using fewer FeCaps, it also has lower variation than a 4 FeCap bitcell. Typically, a single sided cell needs to use a reference voltage that is in the middle of the operating range of the bitcell. This in turn reduces the read margin by half as compared to a two sided cell. However, as circuit fabrication process moves, the reference value may become skewed, further reducing the read margin. A self-reference scheme allows comparison of a single sided cell against itself, thereby providing a higher margin. Tests of the self-referencing cell described herein have provided at least double the margin over a fixed reference cell.

Bitcell 800 has two FeCaps C1, C2 that are connected in series to form node Q 804. Plate line 1 (PL1) is coupled to FeCap C1 and plate line 2 (PL2) is coupled to FeCap C2. The plate lines are use to provide biasing to the FeCaps during reading and writing operations. Pass gate 802 is configured to couple node Q to bitline B. Pass gate 802 is implemented using a PMOS device and an NMOS device connected in parallel. This arrangement reduces voltage drop across the pass gate during a write operation so that nodes Q, QB are presented with a higher voltage during writes and thereby a higher polarization is imparted to the FeCaps. Alternatively, an NMOS pass gate may be used with a boosted word line voltage. In this case, the PASS signal would be boosted by one NFET Vt (threshold voltage). However, this may lead to reliability problems and excess power consumption. Using a CMOS pass gate adds additional area to the bit cell but improves speed and power consumption. Clamp transistor MC 806 is coupled to node Q. Clamp transistor 806 is configured to clamp the Q node to a voltage that is approximately equal to the low logic voltage on the plate lines in response to clear signal CLR during non-access time periods s0, which in this embodiment 0 volts, ground. In this manner, during times when the bit cell is not being accessed for reading or writing, no voltage is applied across the FeCaps and therefore TDDB and unintended partial depolarization is essentially eliminated.

The initial state of node Q, plate lines PL1 and PL2 are all 0, as shown in FIG. 9 at time period s0, so there is no DC bias across the FeCaps when the bitcell is not being accessed. To begin a read operation, PL1 is toggled high while PL2 is kept low, as shown during time period s1. A signal 902 develops on node Q from a capacitance ratio based on the retained polarization of the FeCaps from a last data value previously written into the cell, as described above with regard to equation 1. This voltage is stored on a read capacitor 820 external to the bitcell by passing the voltage though transfer gate 802 onto bit line BL and then through transfer gate 822 in response to a second enable signal EN1. Note: BL and the read capacitors are precharged to VDD/2 before the pass gates 802, 822, and 823 are enabled in order to minimize signal loss via charge sharing when the recovered signals on Q are transferred via BL to the read storage capacitors 820 and 821. Then, PL1 is toggled back low and node Q is discharged using clamp transistor 806 during time period s2. Next, PL2 is toggled high keeping PL1 low during time period s3. A new voltage 904 develops on node Q, but this time with the opposite capacitor ratio. This voltage is then stored on another external read capacitor 821 via transfer gate 823. Thus, the same two FeCaps are used to read a high as well as low signal. Sense amplifier 810 can then determine the state of the bitcell by using the voltages stored on the external read capacitors 820, 821.

Typically, there will be an array of bit cells 800. One column of bit cells 800-800*n* is illustrated in FIG. 8 coupled via bit line 801 to read transfer gates 822, 823. There may then be multiple columns of similar bitcells to form an n row by m column array. For example, in SoC 100, the NVL arrays are 8×32; however, as discussed earlier, different configurations may be implemented. The read capacitors and sense amps may be located in the periphery of the memory array, for example.

Figure 10:
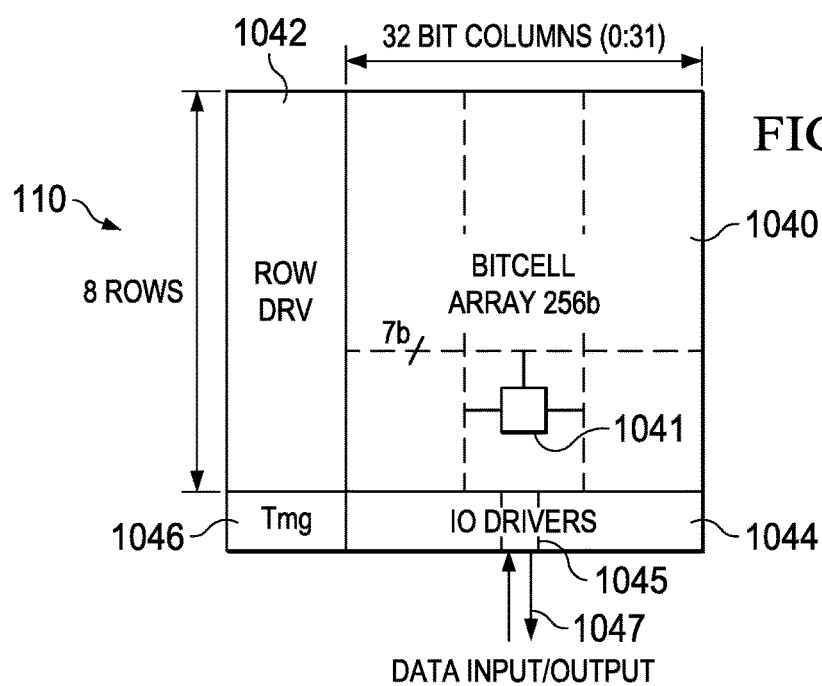
FIG. 10 is a block diagram illustrating an example NVL array used in the SoC of FIG. 1.

FIG. 10 is a block diagram illustrating NVL array 110 in more detail. Embedding non-volatile elements outside the controlled environment of a large array presents reliability and fabrication challenges. As discussed earlier with reference to FIG. 1, adding testability features to individual NVL FFs may be prohibitive in terms of area overhead. To amortize the test feature costs and improve manufacturability, SoC 100 is implemented using 256 b mini-NVL arrays 110, of FeCap based bitcells dispersed throughout the logic cloud to save state of the various flip flops 120 when power is removed. Each cloud 102-104 of FFs 120 includes an associated NVL array 110. A central NVL controller 106 controls all the arrays and their communication with FFs 120.

While an NVL array may be implemented in any number of n rows of m column configurations, in this example, NVL array 110 is implemented with an array 1040 of eight rows and thirty-two bit columns of bitcells. Each individual bit cell, such as bitcell 1041, is coupled to a set of control lines provided by row drivers 1042. The control signals described earlier, including plate lines (PL1, PL2), sense amp enable (SEAN), transfer gate enable (PASS), and clear (CLR) are all driven by the row drivers. There is a set of row drivers for each row of bitcells.

Each individual bit cell, such as bitcell 1041 is also coupled via the bitlines to a set of input/output (JO) drivers 1044. In this implementation, there are thirty-two sets of IO drivers, such as IO driver set 1045. Each driver set produces an output signal 1046 that provides a data value when a row of bit lines is read. Each bitline runs the length of a column of bitcells and couples to an IO driver for that column. Each bitcell may be implemented as 2C-3T bitcell 800, for example. In this case, a single bitline will be used for each column, and the sense amps and read capacitors will be located in IO driver block 1044. In another implementation of NVL array 110, each bitcell may be implemented as 4C-12T bit cell 400. In this case, the bitlines will be a differential pair with two IO drivers for each column. A comparator receives the differential pair of bitlines and produces a final single bit line that is provided to the output latch. Other implementations of NVL array 110 may use other known or later developed bitcells in conjunction with the row drivers and IO drivers that will be described in more detail below.

Timing logic 1046 generates timing signals that are used to control the read drivers to generate the sequence of control signals for each read and write operation. Timing logic 1046 may be implemented using both synchronous or asynchronous state machines, or other known or later developed logic technique. One potential alternative embodiment utilizes a delay chain with multiple outputs that "tap" the delay chain at desired intervals to generate control signals. Multiplexors can be used to provide multiple timing options for each control signal. Another potential embodiment uses a programmable delay generator that produces edges at the desired intervals using dedicated outputs that are connected to the appropriate control signals.

Figure 11A:
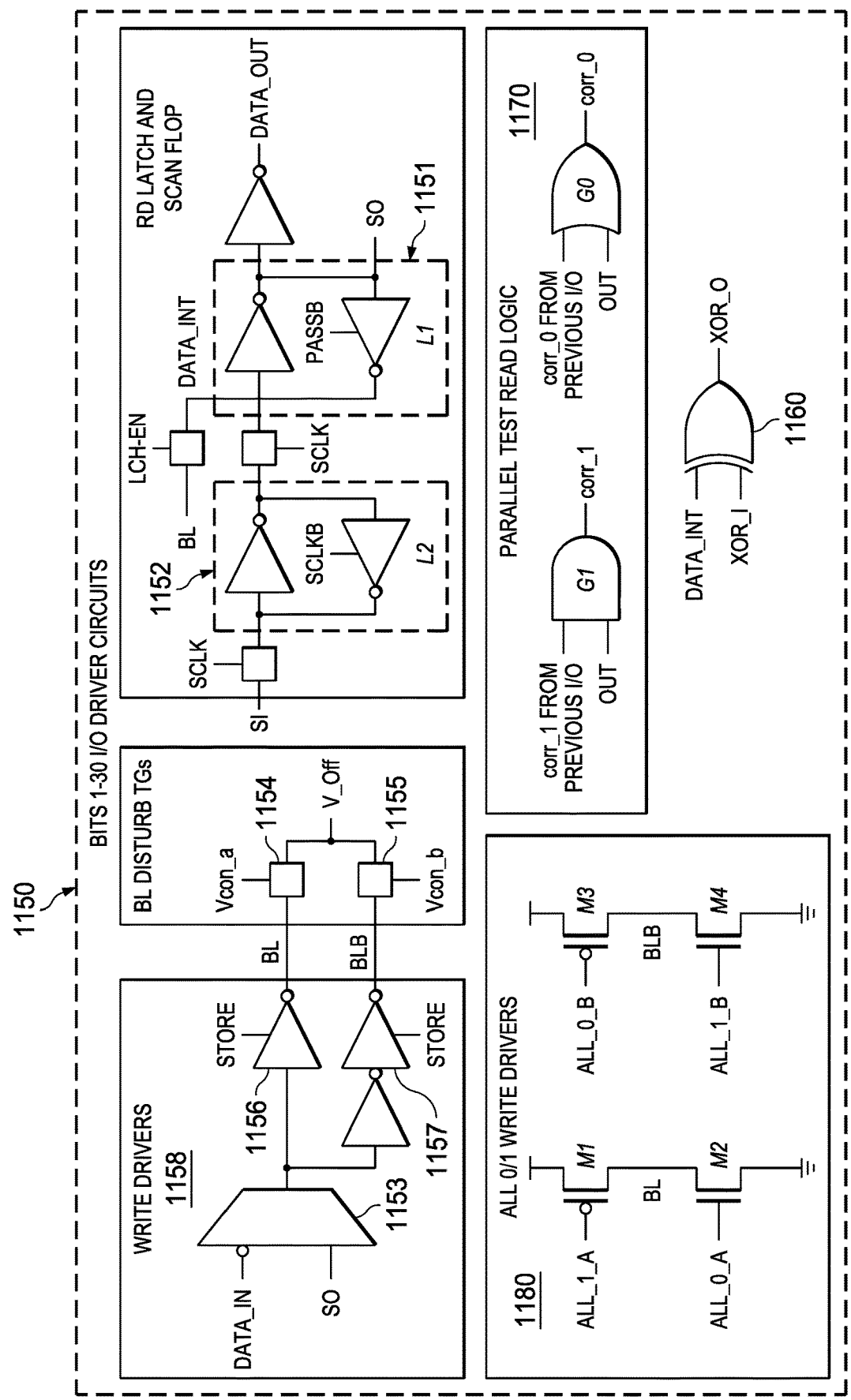
FIGS. 11A and 11B are more detailed schematics of input/output circuits used in the NVL array of FIG. 10.
Figure 11B:
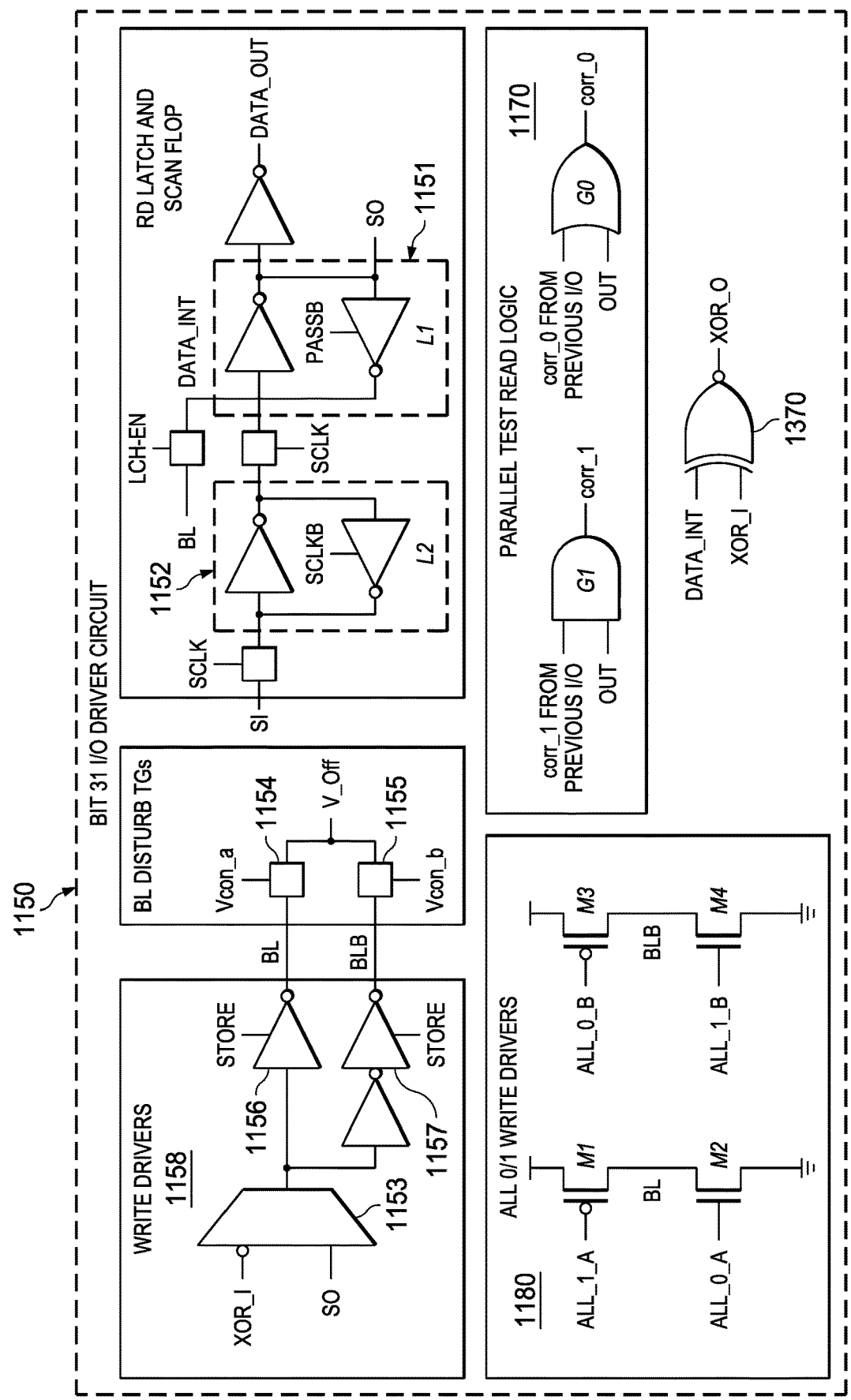

FIG. 11 is a more detailed schematic of a set of input/output circuits 1150 used in the NVL array of FIG. 10. Referring back to FIG. 10, each IO set 1045 of the thirty-two drivers in IO block 1044 is similar to IO circuits 1150. I/O block 1044 provides several features to aid testability of NVL bits.

Referring now to FIG. 11, a first latch (L1) 1151 serves as an output latch during a read and also combines with a second latch (L2) 1152 to form a scan flip flop. The scan output (SO) signal is routed to multiplexor 1153 in the write driver block 1158 to allow writing scanned data into the array during debug. Scan output (SO) is also coupled to the scan input (SI) of the next set of IO drivers to form a thirty-two bit scan chain that can be used to read or write a complete row of bits from NVL array 110. Within SoC 100, the scan latch of each NVL array is connected in a serial manner to form a scan chain to allow all of the NVL arrays to be accessed using the scan chain. Alternatively, the scan chain within each NVL array may be operated in a parallel fashion (N arrays will generate N chains) to reduce the number of internal scan flop bits on each chain in order to speed up scan testing. The number of chains and the number of NVL arrays per chain may be varied as needed. Typically, all of the storage latches and flipflops within SoC 100 include scan chains to allow complete testing of SoC 100. Scan testing is well known and does not need to be described in more detail herein. In this embodiment, the NVL chains are segregated from the logic chains on a chip so that the chains can be exercised independently and NVL arrays can be tested without any dependencies on logic chain organization, implementation, or control. The maximum total length of NVL scan chains will always be less than the total length of logic chains since the NVL chain length is reduced by a divisor equal to the number of rows in the NVL arrays. In the current embodiment, there are 8 entries per NVL array, so the total length of NVL scan chains is $\frac{1}{8}^{th}$ the total length of the logic scan chains. This reduces the time required to access and test NVL arrays and thus reduces test cost. Also, it eliminates the need to determine the mapping between logic flops, their position on logic scan chains and their corresponding NVL array bit location (identifying the array, row, and column location), greatly simplifying NVL test, debug, and failure analysis.

While scan testing is useful, it does not provide a good mechanism for production testing of SoC 100 since it may take a significant amount of time to scan in hundreds or thousands of bits for testing the various NVL arrays within SoC 100. This is because there is no direct access to bits within the NVL array. Each NVL bitcell is coupled to an associated flip-flop and is only written to by saving the state of the flip flop. Thus, in order to load a pattern test into an NVL array from the associated flipflops, the corresponding flipflops must be set up using a scan chain. Determining which bits on a scan chain have to be set or cleared in order to control the contents of a particular row in an NVL array is a complex task as the connections are made based on the physical location of arbitrary groups of flops on a silicon die and not based on any regular algorithm. As such, the mapping of flops to NVL locations need not be controlled and is typically somewhat random.

An improved testing technique is provided within IO drivers 1150. NVL controller 106, referring back to FIG. 1, has state machine(s) to perform fast pass/fail tests for all NVL arrays on the chip to screen out bad dies. In one such approach, at least one non-volatile logic controller is configured to control a built-in-self-test mode where all zeros or all ones are written to at least a portion of an NVL array of the plurality of NVL arrays and then it is determined whether data read from the at least the portion of the NVL array is all ones or all zeros. This is done by first writing all 0's or 1's to a row using all 0/1 write driver 1180, applying an offset disturb voltage (V_Off), then reading the same row using parallel read test logic 1170. Signal corr_1 from AND gate G1 goes high if the data output signal (OUT) from data latch 1151 is high, and signal corr_1 from an adjacent column's IO driver's parallel read test logic AND gate G1 is high. In this manner, the G1 AND gates of the thirty-two sets of I/O blocks 1150 in NVL array 110 implement a large 32 input AND gate that tell the NVL controller if all outputs are high for the selected row of NVL array 110. OR gate G0 does the same for reading 0's. In this manner, the NVL controller may instruct all of the NVL arrays within SoC 100 to simultaneously perform an all ones write to a selected row, and then instruct all of the NVL arrays to simultaneously read the selected row and provide a pass fail indication using only a few control signals without transferring any explicit test data from the NVL controller to the NVL arrays. In typical memory array BIST (Built In Self Test) implementations, the BIST controller must have access to all memory output values so that each output bit can be compared with the expected value. Given there are many thousands of logic flops on typical silicon SOC chips, the total number of NVL array outputs can also measure in the thousands. It would be impractical to test these arrays using normal BIST logic circuits due to the large number of data connections and data comparators required. The NVL test method can then be repeated eight times, for NVL arrays having eight rows (the number of repetitions will vary according to the array organization. In one example, a 10 entry NVL array implementation would repeat the test method 10 times), so that all of the NVL arrays in SoC 100 can be tested for correct all ones operation in only eight write cycles and eight read cycles. Similarly, all of the NVL arrays in SoC 100 can be tested for correct all zeros operation in only eight write cycles and eight read cycles. The results of all of the NVL arrays may be condensed into a single signal indicating pass or fail by an additional AND gate and OR gate that receive the corr_0 and corr_1 signals from each of the NVL arrays and produces a single corr_0 and corr_1 signal, or the NVL controller may look at each individual corr_0 and corr_1 signal.

All 0/1 write driver 1180 includes PMOS devices M1, M3 and NMOS devices M2, M4. Devices M1 and M2 are connected in series to form a node that is coupled to the bitline BL, while devices M3 and M4 are connected in series to form a node that is coupled to the inverse bitline BLB. Control signal "all_1_A" and inverse "all_1_B" are generated by NVL controller 106. When asserted during a write cycle, they activate device devices M1 and M4 to cause the bit lines BL and BLB to be pulled to represent a data value of logic 1. Similarly, control signal "all_0_A" and inverse "all_0_B" are generated by NVL controller 106. When asserted during a write cycle, they activate devices M2 and M3 to cause the bit lines BL and BLB to be pulled to represent a data value of logic 0. In this manner, the thirty-two drivers are operable to write all ones into a row of bit cells in response to a control signal and to write all zeros into a row of bit cells in response to another control signal. One skilled in the art can easily design other circuit topologies to accomplish the same task. The current embodiment is preferred as it only requires 4 transistors to accomplish the required data writes.

During a normal write operation, write driver block 1158 receives a data bit value to be stored on the data_in signal. Write drivers 1156, 1157 couple complimentary data signals to bitlines BL, BLB and thereby to the selected bit cell. Write drivers 1156, 1157 are enabled by the write enable signal STORE.

Figure 12A:
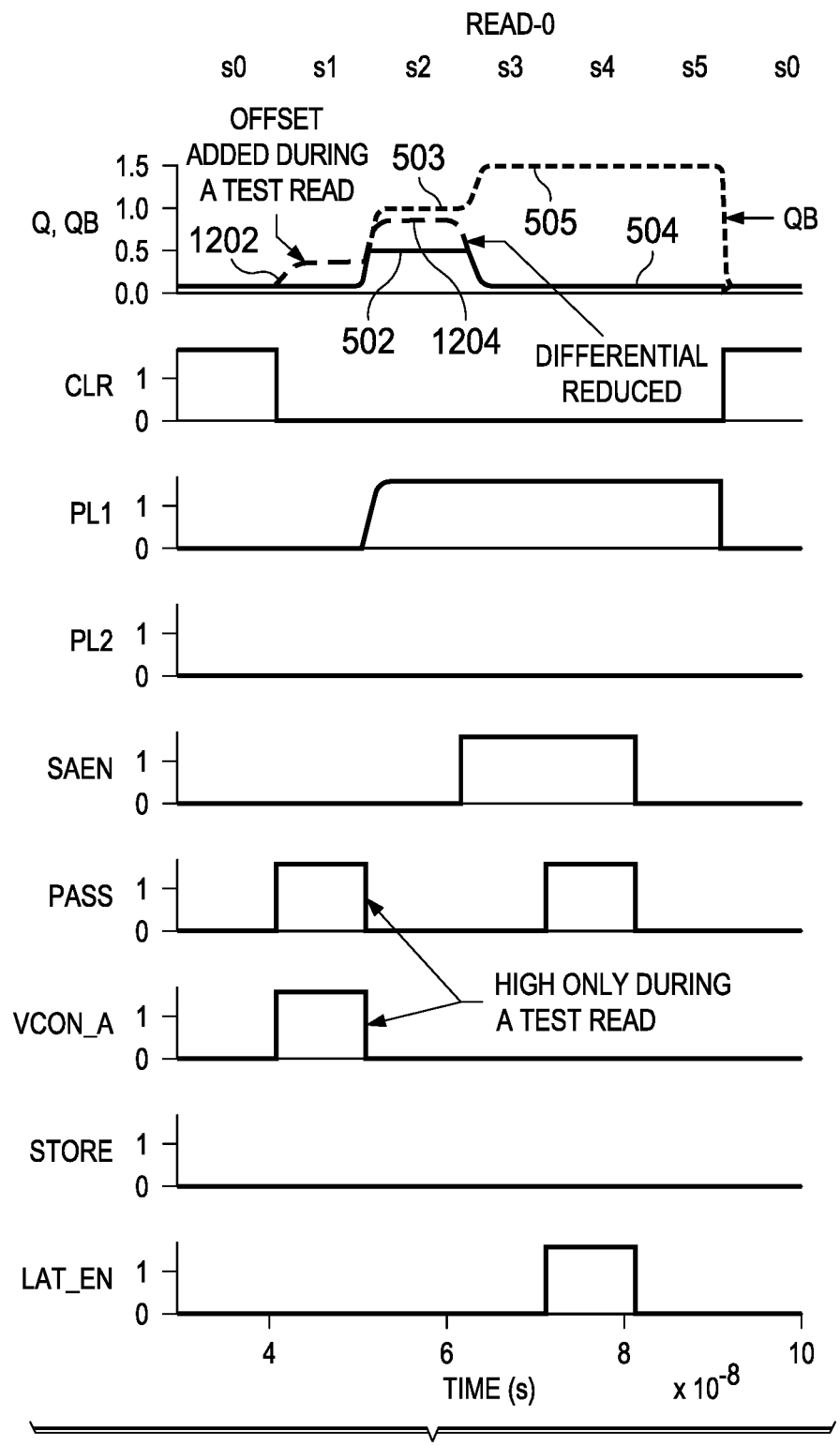
FIG. 12A is a timing diagram illustrating an example offset voltage test during a read cycle as configured in accordance with various embodiments of the invention.

FIG. 12A is a timing diagram illustrating an offset voltage test during a read cycle. To apply a disturb voltage to a bitcell, state s1 is modified during a read. This figure illustrates a voltage disturb test for reading a data value of "0" (node Q); a voltage disturb test for a data value of "1" is similar, but injects the disturb voltage onto the opposite side of the sense amp (node QB). Thus, the disturb voltage in this embodiment is injected onto the low voltage side of the sense amp based on the logic value being read. Transfer gates 1154, 1155 are coupled to the bit line BL, BLB. A digital to analog converter, not shown (may be on-chip, or off-chip in an external tester, for example), is programmed by NVL controller 106, by an off-chip test controller, or via an external production tester to produce a desired amount of offset voltage V_OFF. NVL controller 106 may assert the Vcon control signal for the bitline side storing a "0" during the s1 time period to thereby enable Vcon transfer gate 1154, 1155, discharge the other bit-line using M2/M4 during s1, and assert control signal PASS during s1 to turn on transfer gates 402, 403. This initializes the voltage on node Q/QB of the "0" storing side to offset voltage V_Off, as shown at 1202. This pre-charged voltage lowers the differential available to the SA during s3, as indicated at 1204, and thereby pushes the bitcell closer to failure. For fast production testing, V_Off may be set to a required margin value, and the pass/fail test using G0-1 may then be used to screen out any failing die.

Figure 12B:
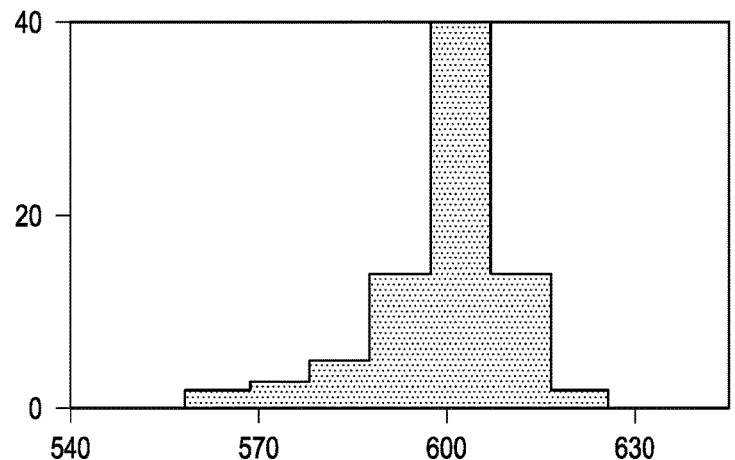
FIG. 12B illustrates a histogram generated during an example sweep of offset voltage as configured in accordance with various embodiments of the invention.

FIG. 12B illustrates a histogram generated during a sweep of offset voltage. Bit level failure margins can be studied by sweeping V_Off and scanning out the read data bits using a sequence of read cycles, as described above. In this example, the worst case read margin is 550 mv, the mean value is 597 mv, and the standard deviation is 22 mv. In this manner, the operating characteristics of all bit cells in each NVL array on an SoC may be easily determined.

As discussed above, embedding non-volatile elements outside the controlled environment of a large array presents reliability and fabrication challenges. The NVL bitcell should be designed for maximum read signal margin and in-situ testability as is needed for any NV-memory technology. However, NVL implementation cannot rely on SRAM like built in self test (BIST) because NVL arrays are distributed inside the logic cloud. The NVL implementation described above includes NVL arrays controlled by a central NVL controller 106. While screening a die for satisfactory behavior, NVL controller 106 runs a sequence of steps that are performed on-chip without any external tester interference. The tester only needs to issue a start signal, and apply an analog voltage which corresponds to the desired signal margin. The controller first writes all 0s or 1s to all bits in the NVL array. It then starts reading an array one row at a time. The NVL array read operations do not necessarily immediately follow NVL array write operations. Often, high temperature bake cycles are inserted between data write operations and data read operations in order to accelerate time and temperature dependent failure mechanisms so that defects that would impact long term data retention can be screened out during manufacturing related testing. As described above in more detail, the array contains logic that ANDS and ORs all outputs of the array. These two signals are sent to the controller. Upon reading each row, the controller looks at the two signals from the array, and based on knowledge of what it previously wrote, decides it the data read was correct or not in the presence of the disturb voltage. If the data is incorrect, it issues a fail signal to the tester, at which point the tester can eliminate the die. If the row passes, the controller moves onto the next row in the array. All arrays can be tested in parallel at the normal NVL clock frequency. This enables high speed on-chip testing of the NVL arrays with the tester only issuing a start signal and providing the desired read signal margin voltage while the NVL controller reports pass at the end of the built in testing procedure or generates a fail signal whenever the first failing row is detected. Fails are reported immediately so the tester can abort the test procedure at the point of first failure rather than waste additional test time testing the remaining rows. This is important as test time and thus test cost for all non-volatile memories (NVM) often dominates the overall test cost for an SOC with embedded NVM. If the NVL controller activates the "done" signal and the fail signal has not been activated at any time during the test procedure, the die undergoing testing has passed the required tests.

For further failure analysis, the controller may also have a debug mode. In this mode, the tester can specify an array and row number, and the NVL controller can then read or write to just that row. The read contents can be scanned out using the NVL scan chain. This method provides read or write access to any NVL bit on the die without CPU intervention or requiring the use of a long complicated SOC scan chains in which the mapping of NVL array bits to individual flops is random. Further, this can be done in concert with applying an analog voltage for read signal margin determination, so exact margins for individual bits can be measured.

These capabilities help make NVL practical because without testability features it would be risky to use non-volatile logic elements in a product. Further, pass/fail testing on-die with minimal tester interaction reduces test time and thereby cost.

NVL implementation using mini-arrays distributed in the logic cloud means that a sophisticated error detection method like ECC would require a significant amount of additional memory columns and control logic to be used on a per array basis, which could be prohibitive from an area standpoint. However, in order to provide an enhanced level of reliability, the NVL arrays of SoC 100 may include parity protection as a low cost error detection method, as will now be described in more detail.

Figure 13:
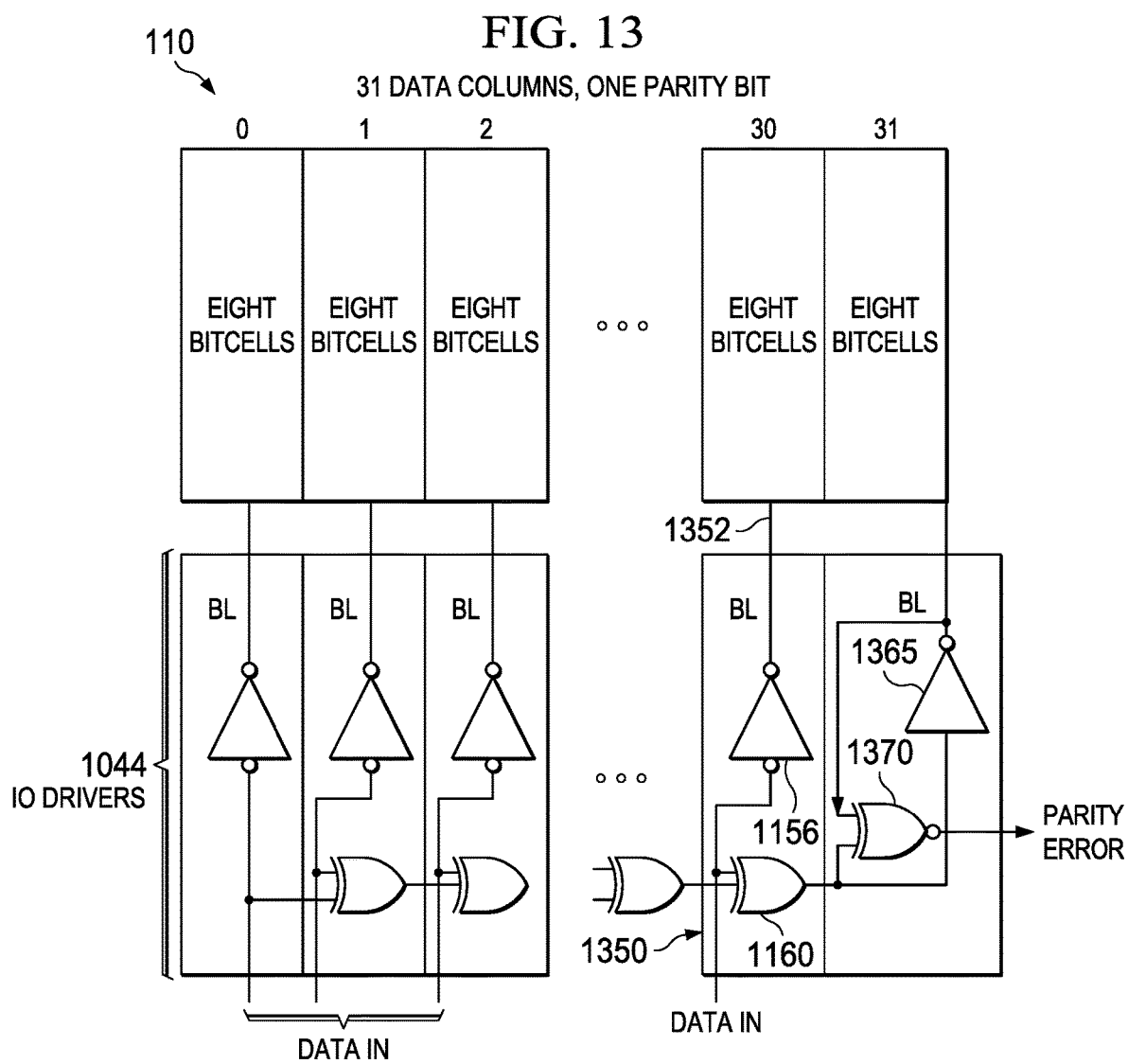
FIG. 13 is a schematic illustrating parity generation in the NVL array of FIG. 10.

FIG. 13 is a schematic illustrating parity generation in NVL array 110 that illustrates an example NVL array having thirty-two columns of bits (0:31), that exclusive-ors the input data value DATA_IN 1151 with the output of a similar XOR gate of the previous column's IO driver. Each IO driver section, such as section 1350, of the NVL array may contain an XOR gate 1160, referring again to FIG. 11A. During a row write, the output of XOR gate 1160 that is in column 30 is the overall parity value of the row of data that is being written in bit columns 0:30 and is used to write parity values into the last column by feeding its output to the data input of column 31 the NVL mini-array, shown as XOR_IN in FIG. 11B.

In a similar manner, during a read, XOR gate 1160 exclusive-ors the data value DATA_OUT from read latch 1151 via mux 1161 (see FIG. 11) with the output of a similar XOR gate of the previous column's IO driver. The output of XOR gate 1160 that is in bit column 30 is the overall parity value for the row of data that was read from bit columns 0:30 and is used to compare to a parity value read from bit column 31 in parity error detector 1370. If the overall parity value determined from the read data does not match the parity bit read from column 31, then a parity error is declared.

When a parity error is detected, it indicates that the stored FF state values are not trustworthy. Since the NVL array is typically being read when the SoC is restarting operation after being in a power off state, then detection of a parity error indicates that a full boot operation needs to be performed in order to regenerate the correct FF state values.

However, if the FF state was not properly stored prior to turning off the power or this is a brand new device, for example, then an indeterminate condition may exist. For example, if the NVL array is empty, then typically all of the bits may have a value of zero, or they may all have a value of one. In the case of all zeros, the parity value generated for all zeros would be zero, which would match the parity bit value of zero. Therefore, the parity test would incorrectly indicate that the FF state was correct and that a boot operation is not required, when in fact it would be required. In order to prevent this occurrence, an inverted version of the parity bit may be written to column 31 by bit line driver 1365, for example. Referring again to FIG. 11A, note that while bit line driver 1156 for columns 0-30 also inverts the input data bits, mux 1153 inverts the data_in bits when they are received, so the result is that the data in columns 0-30 is stored un-inverted. In another embodiment, the data bits may be inverted and the parity error not inverted, for example.

In the case of all ones, if there is an even number of columns, then the calculated parity would equal zero, and an inverted value of one would be stored in the parity column. Therefore, in an NVL array with an even number of data columns with all ones would not detect a parity error. In order to prevent this occurrence, NVL array 110 is constrained to have an odd number of data columns. For example, in this embodiment, there are thirty-one data columns and one parity column, for a total of thirty-two bitcell columns.

In some embodiments, when an NVL read operation occurs, control logic for the NVL array causes the parity bit to be read, inverted, and written back. This allows the NVL array to detect when prior NVL array writes were incomplete or invalid/damaged. Remnant polarization is not completely wiped out by a single read cycle. Typically, it take 5-15 read cycles to fully depolarize the FeCaps or to corrupt the data enough to reliably trigger an NVL read parity. For example, if only four out of eight NVL array rows were written during the last NVL store operation due to loss of power, this would most likely result in an incomplete capture of the prior machine state. However, because of remnant polarization, the four rows that were not written in the most recent state storage sequence will likely still contain stale data from back in time, such as two NVL store events ago, rather than data from the most recent NVL data store event. The parity and stale data from the four rows will likely be read as valid data rather than invalid data. This is highly likely to cause the machine to lock up or crash when the machine state is restored from the NVL arrays during the next wakeup/power up event. Therefore, by writing back the parity bit inverted after every entry is read, each row of stale data is essentially forcibly invalidated.

Writing data back to NVL entries is power intensive, so it is preferable to not write data back to all bits, just the parity bit. The current embodiment of the array disables the PL1, PL2, and sense amp enable signals for all non-parity bits (i.e. Data bits) to minimize the parasitic power consumption of this feature.

In this manner, each time the SoC transitions from a no-power state to a power-on state, a valid determination can be made that the data being read from the NVL arrays contains valid FF state information. If a parity error is detected, then a boot operation can be performed in place of restoring FF state from the NVL arrays.

Referring back to FIG. 1, low power SoC 100 has multiple voltage and power domains, such as VDDN_FV, VDDN_CV for the NVL arrays, VDDR for the sleep mode retention latches and well supplies, and VDDL for the bulk of the logic blocks that form the system microcontroller, various peripheral devices, SRAM, ROM, etc., as described earlier with regard to Table 1 and Table 2. FRAM has internal power switches and is connected to the always on supply VDDZ In addition, the VDDN_FV domain may be designed to operate at one voltage, such as 1.5 volts needed by the FeCap bit cells, while the VDDL and VDDN_CV domain may be designed to operate at a lower voltage to conserve power, such as 0.9-1.5 volts, for example. Such an implementation requires using power switches 108, level conversion and isolation in appropriate areas. Aspects of isolation and level conversion needed with respect to NVL blocks 110 will now be described in more detail. The circuits are designed such that VDDL/VDDN_CV can be any valid voltage less than or equal to VDDN_FV and the circuit will function correctly.

Figure 14:
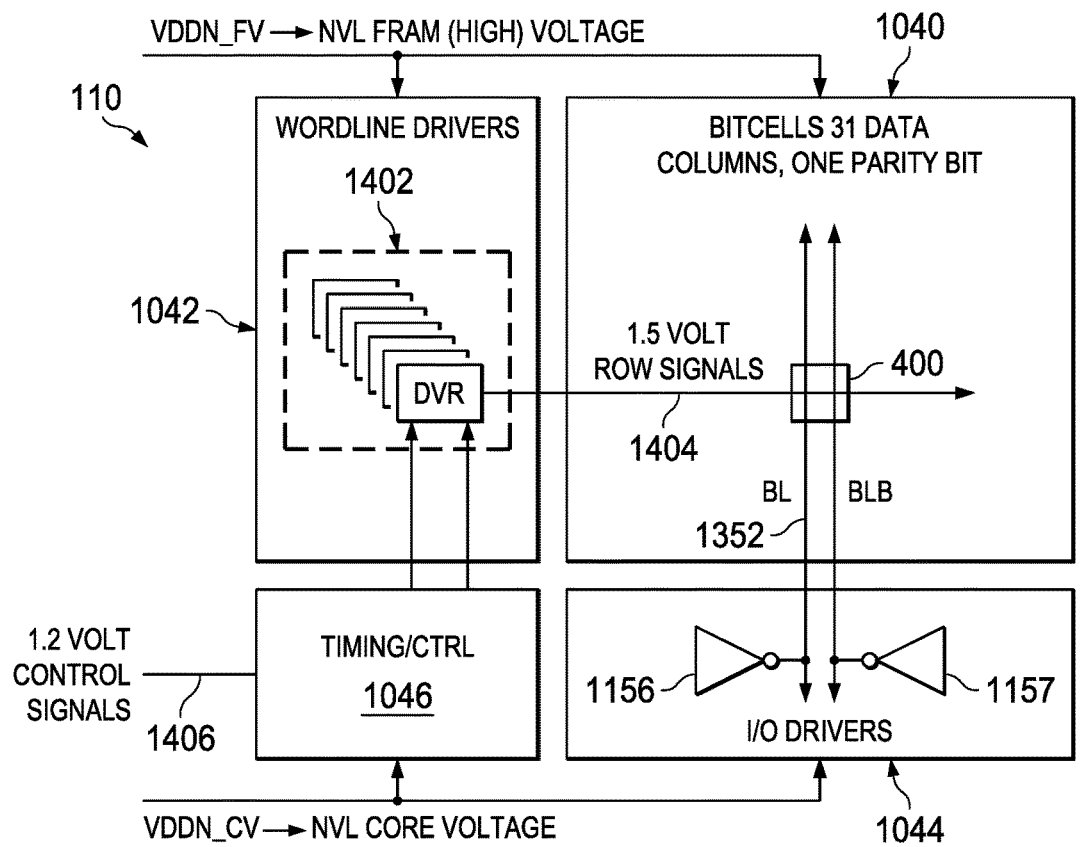
FIG. 14 is a block diagram illustrating example power domains within an NVL array as configured in accordance with various embodiments of the invention.

FIG. 14 is a block diagram illustrating power domains within NVL array 110. Various block of logic and memory may be arranged as illustrated in Table 3.

TABLE 3

| Full Chip Voltage Domain | Voltage level | example full chip power domains |
|---|---|---|
| VDD | 0.9-1.5 | Always ON supply for VDDL, VDDR, VDDN_CV power switches, and always ON logic (if any) |
| VDDZ | 1.5 | Always on 1.5 V supply for FRAM, and for VDDN_FV power switches. FRAM has internal power switches. |
| VDDL | 0.9-1.5 | All logic, and master stage of all flops, SRAM, ROM, Write multiplexor, buffers on FF outputs, and mux outputs: Variable logic voltage; e.g. 0.9 to 1.5 V (VDDL). This supply is derived from the output of VDDL power switches |
| VDDN_CV | 0.9-1.5 | NVL array control and timing logic, and IO circuits, NVL controller. Derived from VDDN_CV power switches. |
| VDDN_FV | 1.5 | NVL array Wordline driver circuits 1042 and NVL bitcell array 1040: Same voltage as FRAM. Derived from VDDN_FV power switches. |
| VDDR | 0.9-1.5 | This is the data retention domain and includes the slave stage of retention flops, buffers on NVL clock, flop retention enable signal buffers, and NVL control outputs such as flop update control signal buffers, and buffers on NVL data outputs. Derived from VDDR power switches. |

Power domains VDDL, VDDN_CV, VDDN_FV, and VDDR described in Table 3 are controlled using a separate set of power switches, such as switches 108 described earlier. However, isolation may be needed for some conditions. Data output buffers within IO buffer block 1044 are in the NVL logic power domain VDDN_CV and therefore may remain off while domain VDDR (or VDDL depending on the specific implementation) is ON during normal operation of the chip. ISO-Low isolation is implemented to tie all such signals to ground during such a situation. While VDDN_CV is off, logic connected to data outputs in VDDR (or VDDL depending on the specific implementation) domain in random logic area may generate short circuit current between power and ground in internal circuits if any signals from the VDDN_CV domain are floating (not driven when VDDN_CV domain is powered down) if they are not isolated. The same is applicable for correct_0/1 outputs and scan out output of the NVL arrays. The general idea here is that any outputs of the NVL array will be isolated when the NVL array has no power given to it. In case there is always ON logic present in the chip, all signals going from VDDL or VDDN_CV to VDD must be isolated using input isolation at the VDD domain periphery. Additional built-in isolation exists in NVL flops at the ND input. Here, the input goes to a transmission gate, whose control signal NU is driven by an always on signal. When the input is expected to be indeterminate, NU is made low, thereby disabling the ND input port. Similar built-in isolation exists on data inputs and scan-in of the NVL array. This isolation would be needed during NVL restore when VDDL is OFF. Additionally, signals NU and NVL data input multiplexor enable signals (mux_sel) must be buffered only in the VDDR domain. The same applies for the retention enable signal.

To enable the various power saving modes of operation, VDDL and VDDN* domain are shut off at various times, and isolation is makes that possible without burning short circuit current.

Level conversion from the lower voltage VDDL domain to the higher voltage VDDN domain is needed on control inputs of the NVL arrays that go to the NVL bitcells, such as: row enables, PL1, PL2, restore, recall, and clear, for example. This enables a reduction in system power dissipation by allowing blocks of SOC logic and NVL logic gates that can operate at a lower voltage to do so. For each row of bitcells in bitcell array 1040, there is a set of word line drivers 1042 that drive the signals for each row of bitcells, including plate lines PL1, PL2, transfer gate enable PASS, sense amp enable SAEN, clear enable CLR, and voltage margin test enable VCON, for example. The bitcell array 1040 and the wordline circuit block 1042 are supplied by VDDN. Level shifting on input signals to 1042 are handled by dedicated level shifters (see FIG. 15), while level shifting on inputs to the bitcell array 1040 are handled by special sequencing of the circuits within the NVL bitcells without adding any additional dedicated circuits to the array datapath or bitcells.

Figure 15:
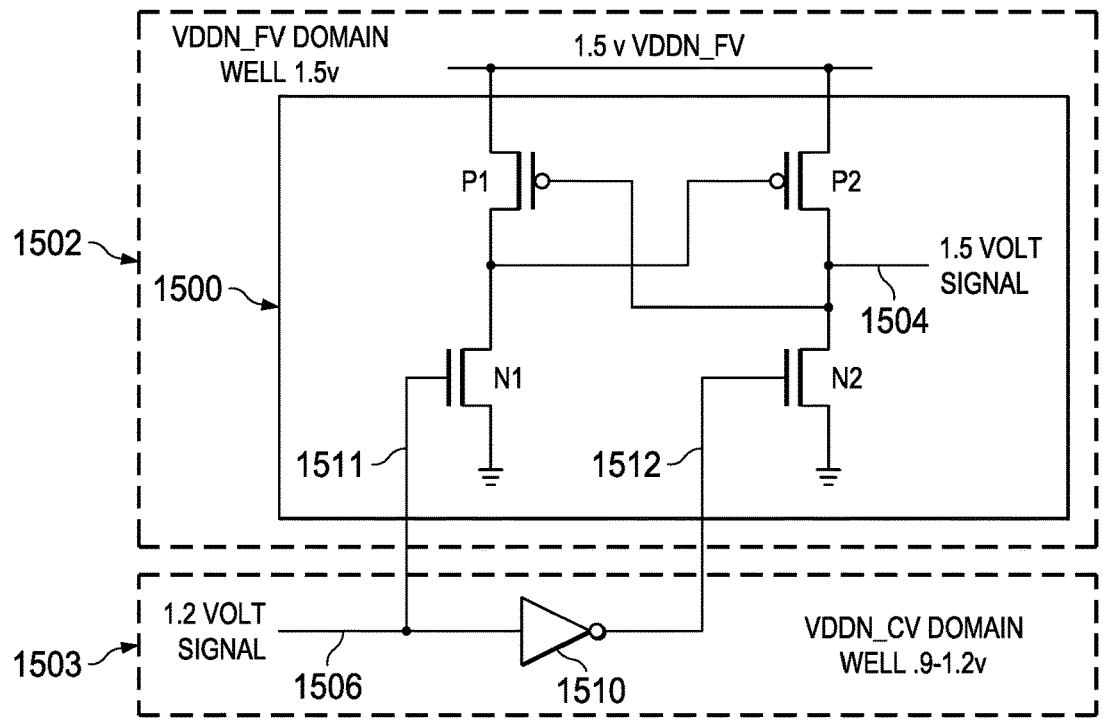
FIG. 15 is a schematic of an example level converter for use in the NVL array as configured in accordance with various embodiments of the invention.

FIG. 15 is a schematic of a level converter 1500 for use in NVL array 110. FIG. 15 illustrates one wordline driver that may be part of the set of wordline drivers 1402. Level converter 1500 includes PMOS transistors P1, P2 and NMOS transistor N1, N2 that are formed in region 1502 in the 1.5 volt VDDN domain for wordline drivers 1042. However, the control logic in timing and control module 1046 is located in region 1503 in the 1.2 v VDDL domain (1.2 v is used to represent the variable VDDL core supply that can range from 0.9 v to 1.5 v). 1.2 volt signal 1506 is representative of any of the row control signals that are generated by control module 1046, for use in accessing NVL bitcell array 1040. Inverter 1510 forms a complimentary pair of control signals 1511, 1512 in region 1503 that are routed to transistors N1 and N2 in level converter 1500. In operation, when 1.2 volt signal 1506 goes high, NMOS device N1 pulls the gate of PMOS device P2 low, which causes P2 to pull signal 1504 up to 1.5 volts. Similarly, when 1.2 volt signal 1506 goes low, complimentary signal 1512 causes NMOS device N2 to pull the gate of PMOS device P1 low, which pulls up the gate of PMOS device P2 and allows signal 1504 to go low, approximately zero volts. The NMOS devices must be stronger than the PMOS so the converter doesn't get stuck. In this manner, level shifting may done across the voltage domains and power may be saved by placing the control logic, including inverter 1510, in the lower voltage domain 1503. For each signal, the controller is coupled to each of level converter 1500 by two complimentary control signals 1511, 1512.

Figure 16:
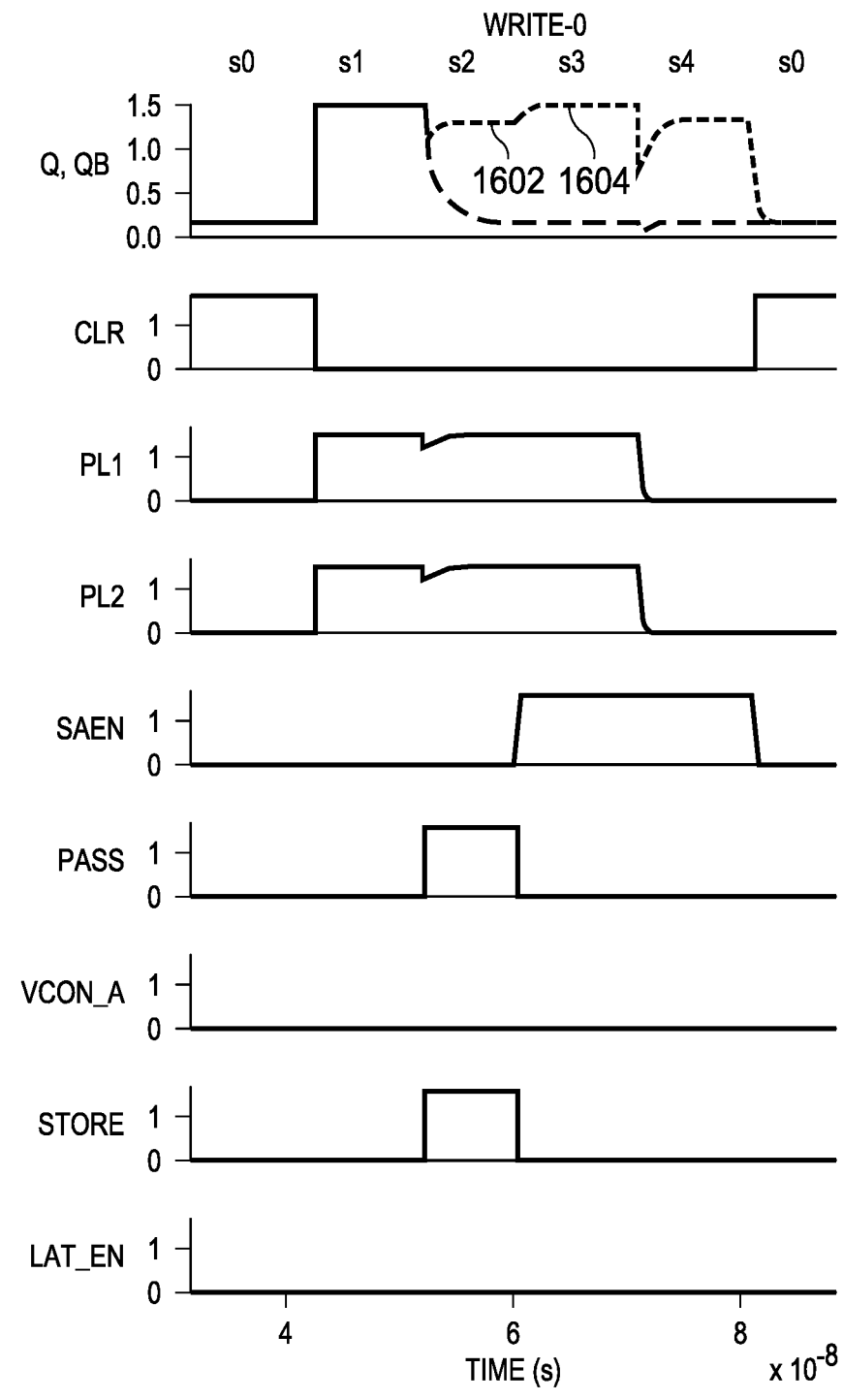
FIG. 16 is a timing diagram illustrating an example operation of level shifting using a sense amp within a ferroelectric bitcell as configured in accordance with various embodiments of the invention.

FIG. 16 is a timing diagram illustrating operation of level shifting using a sense amp within a ferroelectric bitcell. Input data that is provided to NVL array 110 from multiplexor 212, referring again to FIG. 2, also needs to be level shifted from the 1.2 v VDDL domain to 1.5 volts needed for best operation of the FeCaps in the 1.5 volt VDDN domain during write operations. This may be done using the sense amp of bit cell 400, for example. Referring again to FIG. 4 and to FIG. 13, note that each bit line BL, such as BL 1352, which comes from the 1.2 volt VDDL domain, is coupled to transfer gate 402 or 403 within bitcell 400. Sense amp 410 operates in the 1.5 v VDDN power domain. Referring now to FIG. 16, note that during time period s2, data is provided on the bit lines BL, BLB and the transfer gates 402, 403 are enabled by the pass signal PASS during time periods s2 to transfer the data bit and its inverse value from the bit lines to differential nodes Q, QB. However, as shown at 1602, the voltage level transferred is only limited to less than the 1.5 volt level because the bit line drivers are located in the 1.2 v VDDL domain.

Sense amp 410 is enabled by sense amp enable signals SAEN, SAENB during time period s3, s4 to provide additional drive, as illustrated at 1604, after the write data drivers, such as write driver 1156, 1157, have forced adequate differential 1602 on Q/QB during time period s2. Since the sense amp is supplied by a higher voltage (VDDN), the sense amp will respond to the differential established across the sense amp by the write data drivers and will clamp the logic 0 side of the sense amp to VSS (Q or QB) while the other side containing the logic 1 is pulled up to VDDN voltage level. In this manner, the existing NVL array hardware is reused to provide a voltage level shifting function during NVL store operations.

However, to avoid a short from the sense amp to the 1.2 v driver supply, the write data drivers are isolated from the sense amp at the end of time period s2 before the sense amp is turned on during time periods s3, s4. This may be done by turning off the bit line drivers by de-asserting the STORE signal after time period s2 and/or also by disabling the transfer gates by de-asserting PASS after time period s2.

Figure 17:
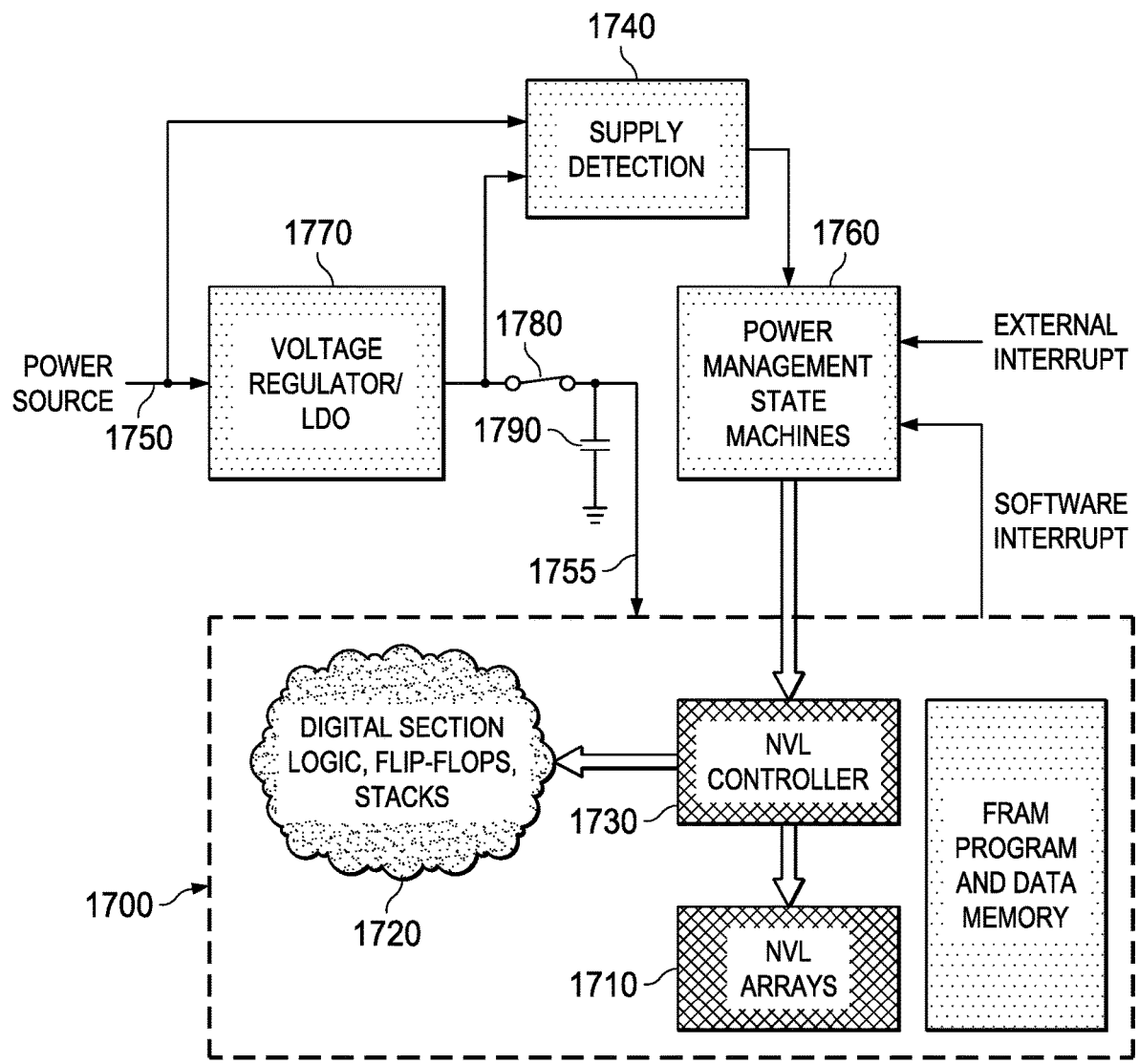
FIG. 17 is a block diagram of an example power detection arrangement as configured in accordance with various embodiments of the invention.

Using the above described arrangements, various configurations are possible to maximize power savings or usability at various points in a processing or computing devices operation cycle. In one such approach, a computing device can be configured to operate continuously across a series of power interruptions without loss of data or reboot. With reference to the example illustrated in FIG. 17, a processing device 1700 as described above includes a plurality of non-volatile logic element arrays 1710, a plurality of volatile storage elements 1720, and at least one non-volatile logic controller 1730 configured to control the plurality of non-volatile logic element arrays 1710 to store a machine state represented by the plurality of volatile storage elements 1720 and to read out a stored machine state from the plurality of non-volatile logic element arrays 1710 to the plurality of volatile storage elements 1720. A voltage or current detector 1740 is configured to sense a power quality from an input power supply 1750.

A power management controller 1760 is in communication with the voltage or current detector 1740 to receive information regarding the power quality from the voltage or current detector 1710. The power management controller 1760 is also configured to be in communication with the at least one non-volatile logic controller 1710 to provide information effecting storing the machine state to and restoration of the machine state from the plurality of non-volatile logic element arrays 1710.

A voltage regulator 1770 is connected to receive power from the input power supply 1750 and provide power to an output power supply rail 1755 configured to provide power to the processing device 1700. The voltage regulator 1770 is further configured to be in communication with the power management controller 1760 and to disconnect the output power supply rail 1755 from the input power supply 1750, such as through control of a switch 1780, in response to a determination that the power quality is below a threshold.

The power management controller 1760 and the voltage or current detector 1740 work together with the at least one non-volatile logic controller 1730 and voltage regulator 1770 to manage the data backup and restoration processes independent of the primary computing path. In one such example, the power management controller 1760 is configured to send a signal to effect stoppage of clocks for the processing device 1700 in response to the determination that the power quality is below the threshold. The voltage regulator 1770 can then send a disconnect signal to the power management controller 1760 in response to disconnecting the output power supply rail 1755 from the input power supply 1750. The power management controller 1760 sends a backup signal to the at least one non-volatile logic controller 1710 in response to receiving the disconnect signal. Upon completion of the backup of system state into NVL arrays, the power can be removed from the SOC, or can continue to degrade without further concern for loss of machine state.

The individual elements that make the determination of power quality can vary in different approaches. For instance, the voltage regulator 1770 can be configured to detect the power quality's rising above the threshold and, in response, to send a good power signal to the power management controller 1760. In response, the power management controller 1760 is configured to send a signal to provide power to the plurality of non-volatile logic element arrays 1710 and the at least one non-volatile logic controller 1730 to facilitate restoration of the machine state. The power management controller 1760 is configured to determine that power up is complete and, in response, send a signal to effect release of clocks for the processing device 1700 wherein the processing device 1700 resumes operation from the machine state prior to the determination that the power quality was below the threshold.

To assure that the processing device 1700 has enough power to complete a backup process, a charge storage element 1790 is configured to provide temporary power to the processing device 1700 sufficient to power it long enough to store the machine state in the plurality of non-volatile logic element arrays 1710 after the output power supply rail 1755 is disconnected from the input power supply 1750. The charge storage element 1790 may be at least one dedicated on-die (or off-die) capacitor designed to store such emergency power. In another approach, the charge storage element 1790 may be circuitry in which naturally occurring parasitic charge builds up in the die where the dissipation of the charge from the circuitry to ground provides sufficient power to complete a backup operation.

The architecture described above can facilitate a number of operation configurations that improve overall processing device function over previous designs. In one such example, when attempting to construct non-volatile SOC's (Systems On a Chip), the simplest method is to back up 100% of the sequential cell states (flops, latches, synchronizer cells, integrated clock gating cells, and the like). This will certainly work, but because the area and power cost of saving and restoring system state in non-volatile storage is significant, it is also inefficient. In addition, wakeup and sleep time is often directly proportional to the number of bits being saved and restored.

To address this concern, a version of the processing or computing device described above can be configured to selectively backup only certain data based on a priority or binning structure. In one approach, the at least one non-volatile logic controller is configured to store the machine state by storing in the plurality of non-volatile logic element arrays a portion of data representing the machine state less than all the data of the machine state. Similarly, the at least one non-volatile logic controller is further configured to store the machine state in the plurality of non-volatile logic element arrays by categorizing a first set of program data of the machine state according to a first category or bin for backup and retention purposes and categorizing a second set of program data of the machine state according to a second category or bin for backup and retention purposes.

The decision on how to bin or categorize the data for backup can be done in a variety of ways. From one point of view, the data is categorized based on the function associated with that data. So configured, individual volatile storage elements associated with the given function are designated to be saved and restored according to the designated category for the associated function. By one such approach, the first set of program data that is stored in the NVL arrays corresponds to cells of the computing device apparatus configured to be active when the computing device apparatus operates in a functional mode. The function data is typically the most important to store on entering the backup mode to facilitate near instantaneous restart of a processing thread and because other data may be pre-stored in NVL arrays. Accordingly, data categorized in the first category or bin and stored in the associated volatile storage element is stored in response to entering a backup mode.

In contrast, the at least one non-volatile logic controller may be configured to store the second set of program data in the plurality of non-volatile logic element arrays in response to the second set of program data representing a default state, which state was entered earlier than entering a backup state from a functional state. More specifically, the second set of program data can correspond to cells of the computing device apparatus configured to be active when the computing device apparatus operates in a test mode or a configuration mode. Accordingly, the second set of program data need not be backed up when the system enters a backup state from the functional mode. In other words, the second category of data can correspond to data that can be used for reset purposes (which is why it is typically stored when the device is in a default state) and would not typically be backed up when entering a backup mode.

Another set of data may not be backed up at all wherein the at least one non-volatile logic controller is further configured to not store in the plurality of non-volatile logic element arrays a third set of program data of the machine state. For example, the third set of program data may correspond to cells of the computing device apparatus configured to be sequential cells with latches that are transparent when a clock for the computing device apparatus is in an inactive state. In another example, the third set of program data corresponds to cells of the computing device apparatus configured to be sequential cells that are part of a data path for read-only instruction buffers or read caches. Such data include sequential cells that can be reset/preset back to default states such as control test related functions that are not used when the SOC is in functional mode. There are typically large numbers of configuration and test control "bits" or registers for which a simple reset/preset pulse is sufficient to restore them to a valid state upon data restoration, which would typically be categorized in the second category or bin. Sequential cells that are part of the data path for read-only instruction buffers or read caches do not have to be backed up at all and can be placed in a third bin for no backup as long as the flops or latches that hold the "data valid" bits for the read buffer/cache are placed in a bin for reset/preset as appropriate to indicate that the cache or buffer is empty.

In specific applications, data cells can be automatically binned into various categories by writing custom algorithms in TCL (tool control language) within formal verification electronic design automation (EDA) tools. Cells that cannot be written in chip functional mode, or whose state is not visible in functional mode will be placed in bins designated to not be necessarily backed up from a functional mode. Similarly, testbenches can be created in high level register transfer level (RTL) simulation code that can execute some key system code that saves and restores system state while issuing a system reset to flops that are candidates for a bin of data backed up on particular occasions and X's into flops that are candidates for a bin of data to not be backed up. Successful completion of the executing code after a save/restore combination with flops in bins getting the treatment just described will confirm the proper bin for each flop. There are a number of methods that can be used to bin or categorize sequential cells.

Figure 18:
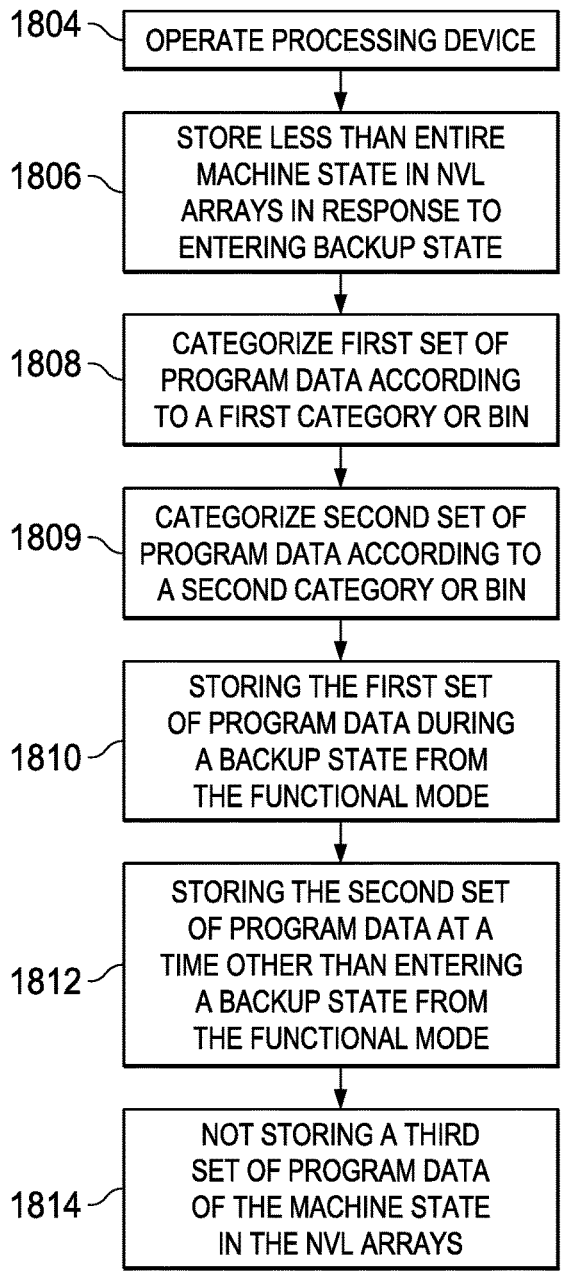
FIG. 18 is a flow chart illustrating an example operation of a processing device categorizing data as configured in accordance with various embodiments of the invention.

FIG. 18 is a flow chart illustrating operation of a processing device categorizing data based on a priority as described above. The method includes operating 1804 a processing device having at least a first processing thread and a second processing thread using a plurality of volatile storage elements. In response to the processing device's entering a backup state, a machine state of the processing device stored in the plurality of volatile store elements is stored in a plurality of non-volatile logic element arrays by storing 1806 a portion of data representing the machine state less than all the data of the machine state. To effect the categorization of which aspects of the machine state are backed up, a first set of program data of the machine state is categorized 1808 according to a first category or bin, and a second set of program data of the machine state is categorized 1809 according to a second category or bin. The first set of program data is stored 1810 in the plurality of non-volatile logic element arrays in response to the computing device apparatus's entering a backup state. For example, the first set of program data may include data from cells of the processing device that are active when the processing device operates in a functional mode such that the processing device may resume right where it left off immediately before entering the backup mode.

The method includes storing 1812 the second set of program data at a time other than entering a backup state from the functional mode, usually because that data can be stored at other earlier times to avoid needed to store the data during a transition from the function state to the backup state. For example, the second set of program data may include data from cells of the processing device that are active when the processing device operates in a test mode or a configuration mode. It sufficient to use this data to reset during a restoration process certain ones of the volatile storage elements to a default state that was stored in the NVL arrays at time before entering the backup mode because the default states typically do not change during the functional or regular operation mode for the processing device.

The method may further include not storing 1814 in the plurality of non-volatile logic element arrays a third set of program data of the machine state. The third set of program data may include cells configured to be sequential cells with latches that are transparent when a clock for the processing device is in an inactive state or cells of the computing device apparatus configured to be sequential cells that are part of a data path for read-only instruction buffers or read caches. In some cases, data in the third category or bin are so categorized to avoid data conflicts during a later restoration process.

Figure 19:
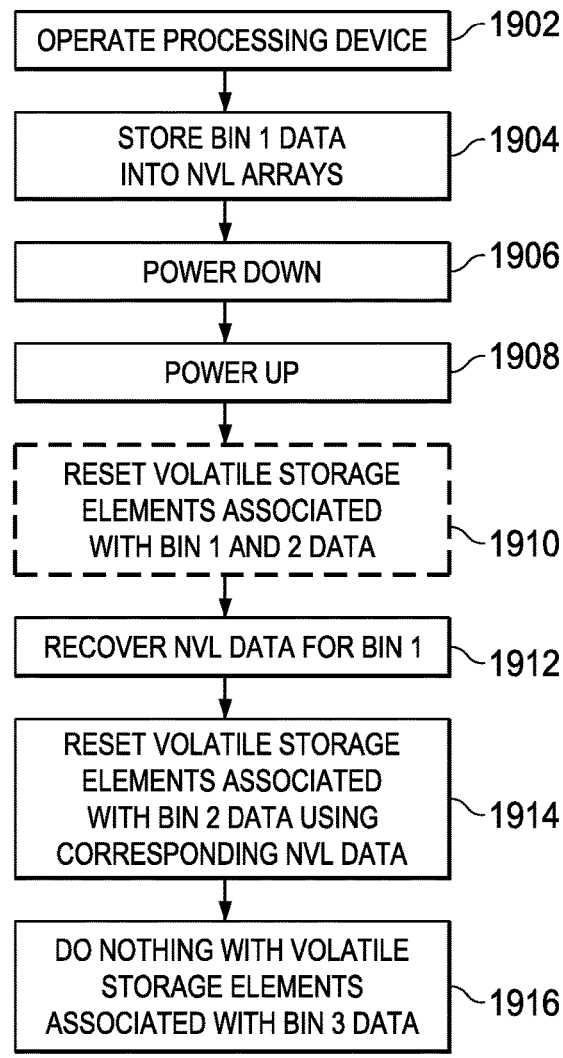
FIG. 19 is a flow chart illustrating another example operation of a processing device backing up data based on a priority as configured in accordance with various embodiments of the invention.

FIG. 19 illustrates an example operation of a processing device categorizing backing up data based on a priority as described above. After the categorization described above is set (although it can be changed at any time), the processing device operates 1902 in a regular mode and then transfers to a backup mode. In the backup mode, data categorized in bin 1 or first category are stored 1904 from associated volatile storage elements like FFs into NVL arrays. After the backup process is complete, the processing device powers down 1906 and later powers back up 1908 to enter a restoration mode. In one optional approach, volatile storage elements associated with category or bin 1 and 2 data is reset 1910 to provide a starting point for the recovery. The method includes recovering 1912 NVL data for that categorized as bin 1. If the reset step 1910 is not completed before recovering the bin 1 data, the method includes resetting 1914 volatile storage elements associated with category or bin 2 data. Nothing is done 1916 with respect to volatile storage elements associated with bin 3 data during the recovery mode.

So configured, data from the processing device can placed into categories or bins that are backed up and restored according to different rules. In this approach, backup and restoration time and power are conserved by not needed to backup and restore an entire machine state.

System Example

Figure 20:
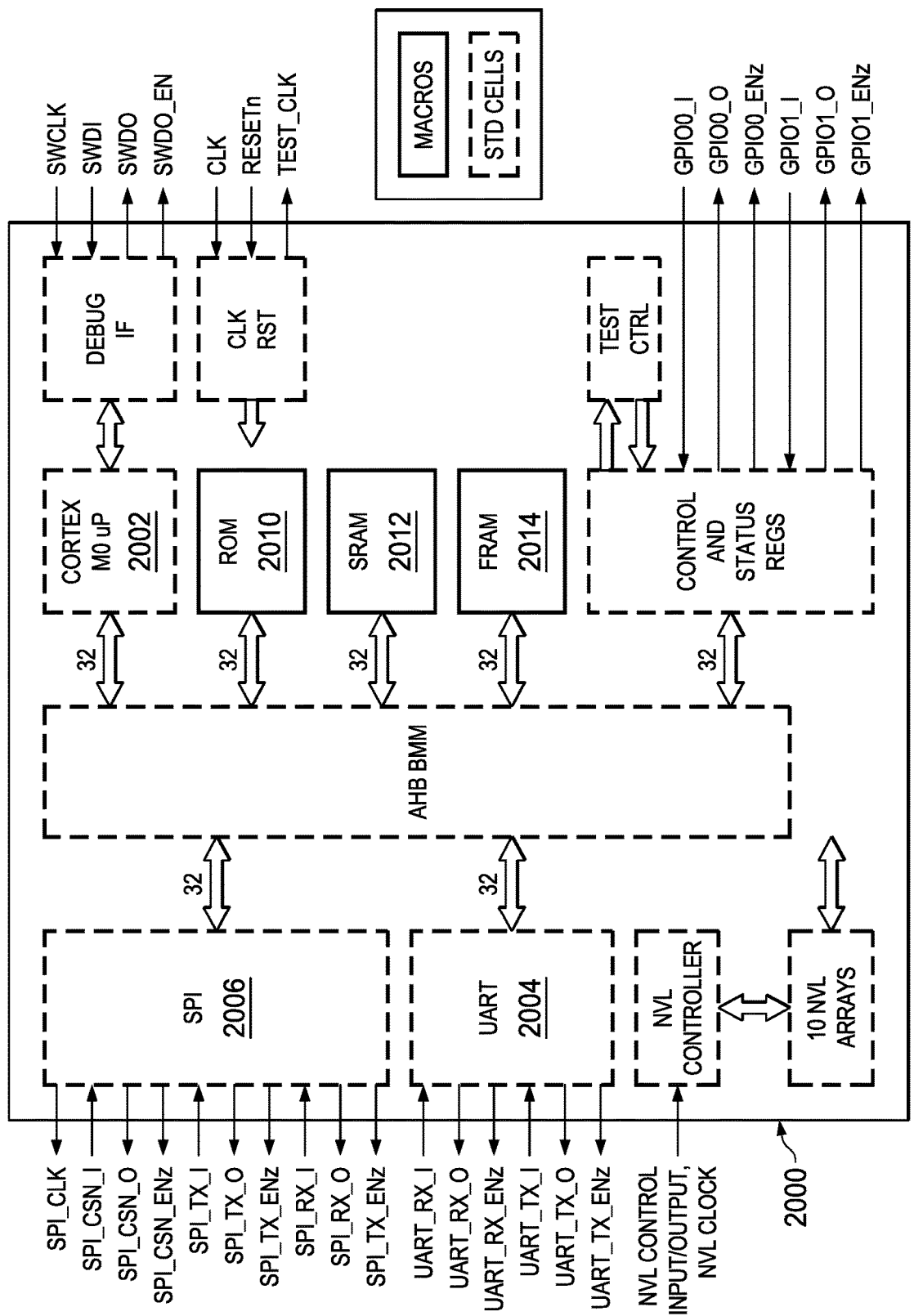
FIG. 20 is a block diagram of another example SoC that includes NVL arrays as configured in accordance with various embodiments of the invention.

FIG. 20 is a block diagram of another SoC 1900 that includes NVL arrays, as described above. SoC 2000 features a Cortex-M0 processor core 2002, universal asynchronous receiver/transmitter (UART) 2004 and SPI (serial peripheral interface) 2006 interfaces, and 10 KB ROM 2010, 8 KB SRAM 2012, 64 KB (Ferroelectric RAM) FRAM 2014 memory blocks, characteristic of a commercial ultra low power (ULP) microcontroller. The 130 nm FRAM process based SoC uses a single 1.5V supply, an 8 MHz system clock and a 125 MHz clock for NVL operation. The SoC consumes 75 uA/MHz & 170 uA/MHz while running code from SRAM & FRAM respectively. The energy and time cost of backing up and restoring the entire system state of 2537 FFs requires only 4.72 nJ & 320 ns and 1.34 nJ & 384 ns respectively, which sets the industry benchmark for this class of device. SoC 2000 provides test capability for each NVL bit, as described in more detail above, and in-situ read signal margin of 550 mV.

SoC 2000 has 2537 FFs and latches served by 10 NVL arrays. A central NVL controller controls all the arrays and their communication with FFs, as described in more detail above. The distributed NVL mini-array system architecture helps amortize test feature costs, achieving a SoC area overhead of only 3.6% with exceptionally low system level sleep/wakeup energy cost of 2.2 pJ/0.66 pJ per bit.

Although the invention finds particular application to microcontrollers (MCU) implemented, for example, in a System on a Chip (SoC), it also finds application to other forms of processors. A SoC may contain one or more modules which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, other portable, or mobile systems such as remote controls, access badges and fobs, smart credit/debit cards and emulators, smart phones, digital assistants, and any other now known or later developed portable or embedded system may embody NVL arrays as described herein to allow nearly immediate recovery to a full operating state from a completely powered down state.

While embodiments of retention latches coupled to a nonvolatile FeCap bitcell are described herein, in another embodiment, a nonvolatile FeCap bitcell from an NVL array may be coupled to flip-flop or latch that does not include a low power retention latch. In this case, the system would transition between a full power state, or otherwise reduced power state based on reduced voltage or clock rate, and a totally off power state, for example. As described above, before turning off the power, the state of the flipflops and latches would be saved in distributed NVL arrays. When power is restored, the flipflops would be initialized via an input provided by the associated NVL array bitcell.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope of the invention.

What is claimed is:

1. A computing device comprising:
   a non-volatile logic element array;
   a volatile storage element configured to store data associated with a machine state of the computing device, wherein the volatile storage element includes:
   a flip-flop having a first data input, a second data input, a clock input, and an output;
   a master latch having an input and an output, the input of the master latch coupled to the first data input of the flip-flop; and
   a slave latch having a first input, a second input, a third input, and a fourth input, the first input coupled to the output of the master latch, the second input coupled to the second data input of the flip-flop, the third input coupled to the clock input of the flip-flop, and a fourth input coupled to an inverse of the clock input of the flip-flop;
   a controller coupled to the non-volatile logic element array and volatile storage element, the controller configured to:
   identify a portion of data on the volatile storage element for use in a test mode; and
   store the identified portion of data in the non-volatile logic element array.

2. The computing device of claim 1 wherein the controller is configured to store the identified portion of data by categorizing a first set of data of the machine state according to a first category for backup and restoration and categorizing a second set of data of the machine state according to a second category for backup and restoration, wherein the second set of program data is the identified portion of data.

3. The computing device of claim 2 wherein the controller is configured to store the first set of program data in the non-volatile logic element array in response to the computing device entering a backup state.

4. The computing device of claim 3 wherein the first set of program data corresponds to volatile storage element being active when the computing device apparatus operates in a functional mode.

5. The computing device of claim 2 wherein the controller is configured to store the second set of program data in the non-volatile logic element arrays in response to the second set of program data representing a default state.

6. The computing device of claim 5 wherein the second set of program data corresponds to volatile storage element being active when the computing device operates in a test mode or a configuration mode.

7. The computing device of claim 2 wherein the controller is configured to not store, in the non-volatile logic element array, a third set of data of the machine state.

8. The computing device of claim 7 wherein the third set of data corresponds to cells of the computing device configured to be sequential cells with latches that are transparent when a clock for the computing device apparatus is in an inactive state.

9. The computing device of claim 7 wherein the third set of data corresponds to cells of the computing device configured to be sequential cells that are part of a data path for read-only instruction buffers or read caches.

10. A method comprising:
   storing data associated with a machine state of a processing device on a volatile storage element in a processing device, wherein the volatile storage element includes:
      a flip-flop having a first data input, a second data input, a clock input, and an output;
      a master latch having an input and an output, the input of the master latch coupled to the first data input of the flip-flop; and
      a slave latch having a first input, a second input, a third input, and a fourth input, the first input coupled to the output of the master latch, the second input coupled to the second data input of the flip-flop, the third input coupled to the clock input of the flip-flop, and a fourth input coupled to an inverse of the clock input of the flip-flop;
   identifying a portion of data on the volatile storage element for use in a test mode;
   storing the identified portion of data in a non-volatile logic element array.

11. The method of claim 10 wherein the storing the data further comprises storing a first set of data of the machine state according to a first category and storing a second set of data of the machine state according to a second category, wherein the second set of program data is the identified portion data.

12. The method of claim 11 wherein the storing the data further comprises storing the first set of data in the non-volatile logic element array in response to the processing device entering a backup state.

13. The method of claim 12 wherein the storing the first set of data comprises storing data from the volatile storage element that is active when the processing device operates in a functional mode.

14. The method of claim 11 wherein the storing the data further comprises storing the second set of data in the logic element arrays in response to the processing device entering a default state.

15. The method of claim 14 wherein the storing the second set of data comprises storing data from the volatile storage element that is active when the processing device operates in a test mode or a configuration mode.

16. The method of claim 11 further comprising not storing, in the non-volatile logic element array, a third set of data of the machine state.

17. The method of claim 16 wherein the not storing the third set of data comprises not storing data from cells that are configured to be sequential cells with latches that are transparent when a clock for the processing device is in an inactive state.

18. The method of claim 16 wherein the not storing the third set of data comprises not storing data from cells of the processing device apparatus that are configured to be sequential cells that are part of a data path for read-only instruction buffers or read caches.

* * * * *